United States Patent
Demizu et al.

(10) Patent No.: US 10,509,866 B2
(45) Date of Patent: Dec. 17, 2019

(54) RESONANCE FREQUENCY CHECK METHOD AND RESONANCE FREQUENCY CHECK APPARATUS

(71) Applicant: FUJITSU LIMITED, Kawasaki-shi, Kanagawa (JP)

(72) Inventors: Koji Demizu, Atsugi (JP); Kai Nojima, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 516 days.

(21) Appl. No.: 15/229,859

(22) Filed: Aug. 5, 2016

(65) Prior Publication Data

US 2017/0046453 A1 Feb. 16, 2017

(30) Foreign Application Priority Data

Aug. 12, 2015 (JP) ................. 2015-159375

(51) Int. Cl.
*G06F 17/50* (2006.01)
(52) U.S. Cl.
CPC .................. *G06F 17/50* (2013.01)
(58) Field of Classification Search
CPC ....................................................... G06F 17/50
USPC ........................................................... 703/1
See application file for complete search history.

(56) References Cited

U.S. PATENT DOCUMENTS

| | | | |
|---|---|---|---|
| 5,815,414 A | 9/1998 | Funaki et al. | |
| 8,412,506 B2* | 4/2013 | Yamagajo | G06F 17/5018 703/13 |
| 8,744,824 B2* | 6/2014 | Duan | G06F 17/5018 703/1 |
| 2003/0212537 A1 | 11/2003 | Ueno et al. | |

FOREIGN PATENT DOCUMENTS

| | | |
|---|---|---|
| JP | 8-122377 | 5/1996 |
| JP | 2003-323466 | 11/2003 |
| JP | 2007214443 A * | 8/2007 |
| JP | 2008-171106 | 7/2008 |
| JP | 2010-92244 | 4/2010 |
| JP | 2010-205139 | 9/2010 |
| JP | 2013-122731 | 6/2013 |
| JP | 2015-26173 | 2/2015 |
| JP | 2015-114728 | 6/2015 |

OTHER PUBLICATIONS

Zheng et al, "Simulation of Chassis Electromagnetic Shielding Characteristic Based on ANSYS", 2008, IEEE International Conference (Year: 2008).*

* cited by examiner

*Primary Examiner* — Kamini S Shah
*Assistant Examiner* — Faraj Ayoub
(74) *Attorney, Agent, or Firm* — Staas & Halsey LLP

(57) ABSTRACT

An apparatus includes a memory; and a processor coupled to the memory and configured to: specify a shape type of an opening including a series of planes detected from planes of a plurality of second virtual rectangular parallelepipeds obtained by dividing a first virtual rectangular parallelepiped internally containing a virtual object in a simulated space based on a first shape of a first line obtained by projecting the series of planes from a direction based on a specific plane of the first virtual rectangular parallelepiped onto a projection plane which is perpendicular to the direction and located at a position more distant from the specific plane than the series of planes, calculate a resonance frequency of a wave leaking through the opening, based on the specified shape type of the opening; and present the calculated resonance frequency on a display.

13 Claims, 34 Drawing Sheets

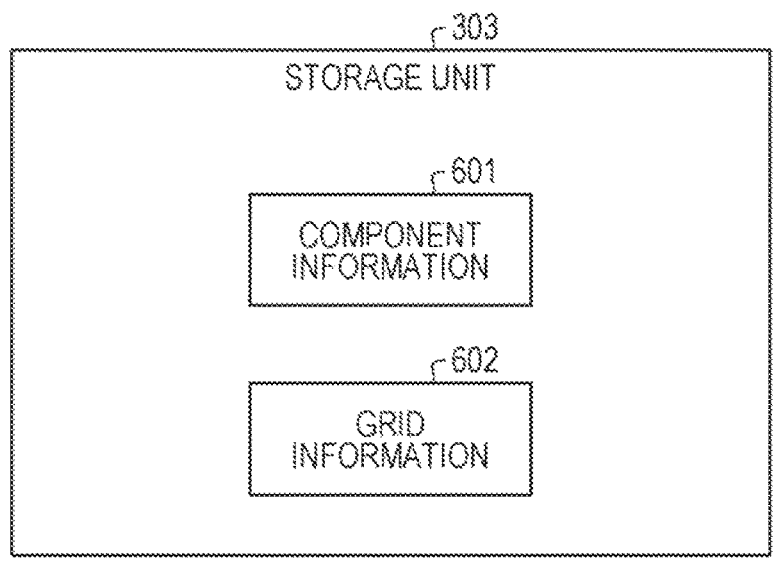

FIG. 10

| GRID POSITION | GRID ATTRIBUTE | CONDUCTIVITY | PLANE (Xmin, Xmax, Ymin, Ymax, Zmin, Zmax) | |
|---|---|---|---|---|
| 1, 1, 1 | EXTERNAL REGION SPACE | - | -, -, -, BOUNDARY, -, - | ~1000-1 |
| 2, 1, 1 | INTERNAL REGION SPACE | - | -, -, BOUNDARY, -, -, - | ~1000-2 |
| 3, 1, 1 | COMPONENT | CONDUCTIVE | -, -, -, -, -, - | ~1000-3 |
| 4, 1, 1 | COMPONENT | CONDUCTIVE | -, -, -, -, -, - | ~1000-4 |
| 5, 1, 1 | COMPONENT (EXTERNAL REGION) | NON-CONDUCTIVE | -, -, -, BOUNDARY, -, - | ~1000-5 |
| 6, 1, 1 | INTERNAL REGION SPACE | - | -, -, BOUNDARY, -, -, - | ~1000-6 |

FIG. 11

| BOUNDARY PLANE ID | GRID POSITION | DIRECTION | |
|---|---|---|---|
| BOUNDARY PLANE 0001 | 1, 1, 1 | Xmax | ⎫ |
| | 1, 2, 1 | Xmax | ⎬ 1101-1 |
| | 1, 3, 1 | Xmax | ⎭ |
| ... | ... | ... | |
| BOUNDARY PLANE 0015 | 1, 1, 90 | Zmax | |
| | 1, 2, 90 | Zmax | |
| ... | ... | ... | |

FIG. 12

| OPENING ID | OPENING POSITION COORDINATE (min-max) | BOUNDARY PLANE ID | OPENING DIRECTION | |
|---|---|---|---|---|
| OPENING 0001 | 0, 0, 0-0, 1, 90 | BOUNDARY PLANE 0001, BOUNDARY PLANE 0015, ... | +X | ~1201-1 |
| ... | ... | ... | ... | |

FIG. 24

| OPENING ID | PERIPHERAL LINE LENGTH | TYPE | TYPE-BY-TYPE PERIPHERAL LENGTH | RESONANCE FREQUENCY [Hz] | CONNECTION SPOT | CONNECTION POSITION | |
|---|---|---|---|---|---|---|---|
| OPENING 0001 | 91 | SLIT | 91 | 3.3e+6 | REFLECTED | 0, 1, 45 | ~2401-1 |
| ... | ... | ... | ... | ... | ... | ... | |

FIG. 27

| FREQUENCY | NUMBER OF OPENINGS | COMPOSITION OF SHAPE TYPES OF OPENINGS | PERIPHERAL LENGTH | LOCATION | SHAPE TYPE OF OPENING |
|---|---|---|---|---|---|
| 20 | 2 | | ** | +X | < SLIT > |
| 100 | 4 | | ** | -Y | < LOOP > |
| 1000 | 1 | | ** | -Y | < LOOP > |
| 10000 | 4 | | ** | +Y | < OPENING > |

RESONANCE FREQUENCY CHECK METHOD AND RESONANCE FREQUENCY CHECK APPARATUS

CROSS-REFERENCE TO RELATED APPLICATION

This application is based upon and claims the benefit of priority of the prior Japanese Patent Application No. 2015-159375, filed on Aug. 12, 2015, the entire contents of which are incorporated herein by reference.

FIELD

The embodiment discussed herein is related to a resonance frequency check method and a resonance frequency check apparatus.

BACKGROUND

There has heretofore been known a technique of constructing a three-dimensional object in a simulated space. Also, in the recent electric and electronic devices, digitization and speeding up of electronic circuits have increased electromagnetic noise and exogenous noise. Therefore, an electromagnetic compatibility (EMC) design is made to reduce generation of radio noise and to ensure resistance to the exogenous noise.

There has heretofore been known, for example, a technique of specifying an opening in an object, through which radio waves, static electricity, and the like come in and out (see, for example, Japanese Laid-open Patent Publication No. 2015-114728).

Also, there has heretofore been known, for example, a technique of checking an electrical connection state of two component models included in a three-dimensional assembly model (see, for example, Japanese Laid-open Patent Publication No. 2015-026173).

Moreover, there has heretofore been known, for example, a technique of calculating a resonance frequency from an opening size in an electromagnetic field intensity calculation apparatus (see, for example, Japanese Laid-open Patent Publication No. H08-122377).

Moreover, there has heretofore been known, for example, a technique in which, if a hole shape unrelated to welding is included in an apparatus having a three-dimensional shape indicated by a three-dimensional shape data on a display screen, the hole shape is easily and quickly selected and deleted (see, for example, Japanese Laid-open Patent Publication No. 2010-205139).

Moreover, there has heretofore been known, for example, a technique of analyzing an electromagnetic wave resonance phenomenon of a product housing attributed to its structure at a frequency to be reduced, and visualizing the entire region of the analysis while suppressing the use of computational resources (see, for example, Japanese Laid-open Patent Publication No. 2010-92244).

Furthermore, there has heretofore been known, for example, a technique of suppressing unnecessary electromagnetic radiation attributed to a common mode current related to a system including a printed circuit board and a metal housing when the ground of the printed circuit board is connected and fixed to the metal housing in an electronic device, for example (see, for example, Japanese Laid-open Patent Publication No. 2008-171106).

However, in the conventional techniques, it is difficult to detect a resonance frequency of a wave leaking through an opening included in an object in a simulated space at the early stage of design. For this reason, a leakage spot of the wave may only be identified at the final stage of design, leading to significant rework of design. Therefore, a method for identifying in advance a spot where leakage may occur has been demanded.

According to one aspect, it is an object of the embodiment to provide a resonance frequency check method and a resonance frequency check apparatus capable of specifying a wave leakage spot and reducing rework of design of the leakage spot.

SUMMARY

According to an aspect of the embodiments, an apparatus includes a memory; and a processor coupled to the memory and configured to: specify a shape type of an opening including a series of planes detected from planes of a plurality of second virtual rectangular parallelepipeds obtained by dividing a first virtual rectangular parallelepiped internally containing a virtual object in a simulated space based on a first shape of a first line obtained by projecting the series of planes from a direction based on a specific plane of the first virtual rectangular parallelepiped onto a projection plane which is perpendicular to the direction and located at a position more distant from the specific plane than the series of planes, calculate a resonance frequency of a wave leaking through the opening, based on the specified shape type of the opening; and present the calculated resonance frequency on a display.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is an explanatory diagram illustrating a detailed example of a storage unit;

FIG. 7 is an explanatory diagram illustrating a stored content example of component information;

FIG. 10 is an explanatory diagram illustrating a grid information example;

FIG. 11 is an explanatory diagram illustrating a stored content example of boundary plane information;

FIG. 12 is an explanatory diagram illustrating a stored content example of opening information;

FIG. 24 is an explanatory diagram illustrating an opening type information example;

FIG. 27 is an explanatory diagram illustrating a list display example of the resonance frequency;

DESCRIPTION OF EMBODIMENT

Hereinafter, with reference to the accompanying drawings, detailed description is given of an embodiment of a resonance frequency check program, a resonance frequency check method, and a resonance frequency check apparatus.

Figure 1:
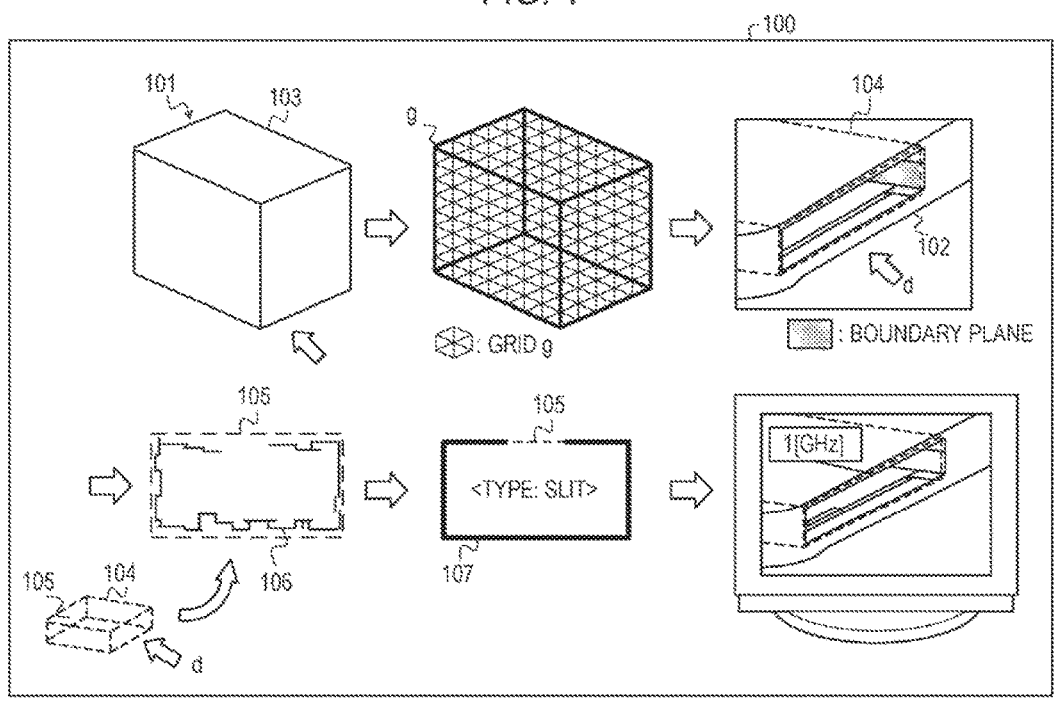
FIG. 1 is an explanatory diagram illustrating an operation example of a resonance frequency check apparatus according to an embodiment.

FIG. 1 is an explanatory diagram illustrating an operation example of the resonance frequency check apparatus according to the embodiment. A resonance frequency check apparatus is a computer to specify a resonance frequency of an opening in an object 102 disposed in a simulated space 101. The opening of the object 102 is an opening connected to the inside of the object 102. The resonance frequency is a frequency of a wave that leaks through the opening.

Here, the simulated space 101 is a virtual three-dimensional space simulated on the computer. To be more specific, for example, the simulated space 101 is a space virtually set in the resonance frequency check apparatus by a computer aided designed (CAD) for designing a three-dimensional assembly. In the simulated space 101, a three-dimensional orthogonal coordinate system having x-axis, y-axis, and z-axis is defined.

Here, the object 102 is an assembly model formed of two or more components, for example. The object 102 may be a model obtained by virtualizing the whole product on the computer or may be an assembly model obtained by virtualizing a part of a product on the computer. The object 102 is an assembly model obtained by virtualizing a mechanical product or the like, such as a personal computer (PC), a tablet PC, a server, a personal digital assistance, a smartphone, a car, and a home appliance, on the computer. The component is a smallest unit that may not be broken down further. Also, the respective components are expressed by three-dimensional CAD data including positional information and the like, for example. A component information example is described later with reference to FIG. 7.

Conventionally, the resonance frequency of the wave leaking through the opening and the degree of such leakage may not be specified unless conditions for all models of components included in the object 102 such as after the completion of the design of the object 102 in the simulated space 101. For example, in order to specify the resonance frequency, the degree of the leakage of a wave, and the like, boundary condition setting such as connection of a transmitter and a frequency of the transmitter, physical calculation, and the like are performed. As described above, at the early stage of design in the conventional technique, it is difficult to detect the resonance frequency of the wave leaking through the opening included in the object 102 in the simulated space 101. Therefore, it is difficult to specify a wave leakage spot. The early stage of design is a state where an internal structure is insufficient or unspecified. Also, in a state where the internal structure is insufficient or where the shape of the internal structure is unspecified, there is a significant difference in shape from the final stage of design in a simulation using a permittivity and a noise source.

Therefore, in this embodiment, the resonance frequency check apparatus 100 focuses on an opening seen from outside using a combination of housing dielectric bodies, specifies the shape type of the opening based on the shape of lines obtained by projecting a series of boundary planes included in the opening onto a projection plane from the inside, and obtains the resonance frequency of the wave leaking through the opening based on the specified type.

Thus, the resonance frequency of the wave leaking through the opening of the object 102 may be specified even in the middle of designing the object 102 in the simulated space 101. If the resonance frequency of the wave leaking through each opening may be specified, a leakage spot of radio wave may be specified. Also, since the leakage spot of the radio wave may be specified even in the middle of designing the object 102, the design may be simplified such as changing the size of the opening. Moreover, by specifying the leakage spot of a wave at the early stage of design where the internal structure is insufficient or unspecified, a design may be made with measures against the leakage of the wave while checking from the early stage of design. Thus, detection of problems with the leakage of the wave is reduced even if a conventional simulation is conducted at the final stage of design, and rework of design may be reduced.

The resonance frequency check apparatus 100 specifies the shape type of an opening including a series of planes detected, based on the shape of lines obtained by projecting the series of planes onto a projection plane from a direction based on a first virtual rectangular parallelepiped 103.

The series of planes are detected from planes included in a plurality of second virtual rectangular parallelepipeds obtained by dividing the first virtual rectangular parallelepiped 103 internally containing the object 102 based on component information indicating each of a plurality of components included in the object 102. Each of the second virtual rectangular parallelepipeds is also called a grid g. The series of planes are consecutive boundary planes detected using the conventional technique (for example, Japanese Laid-open Patent Publication No. 2015-114728 aforementioned).

The boundary plane is a plane overlapping between an external region space and an internal region space, for example. The external region space is a third virtual rectangular parallelepiped having no grid g including at least some of the plurality of components between a plane normal to at least any of the planes of the first virtual rectangular parallelepiped 103 and the grid g among the plurality of grids g. The internal region space is a fourth virtual rectangular parallelepiped obtained by excluding the external region space and the grid g including at least some of the plurality of components among the plurality of grids g from the plurality of grids g.

The direction based on the first virtual rectangular parallelepiped 103 is a direction opposite to a direction of a normal vector to the planes of the first virtual rectangular parallelepiped 103. Also, a direction based on a specific plane of the first virtual rectangular parallelepiped 103 is a direction intersecting with the object 102 among directions perpendicular to the specific plane of the first virtual rectangular parallelepiped 103. Here, the direction based on the specific plane of the first virtual rectangular parallelepiped 103 is also referred to as an inward direction d. A line obtained by projecting a series of boundary planes included in the opening is formed of an assembly of sides seen when the sides forming the series of boundary planes are seen from the inward direction d.

The projection plane is a plane perpendicular to the inward direction d, which is positioned more distant from the specific plane than the series of planes. To be more specific, the projection plane is, for example, a plane perpendicular to the inward direction d, which is positioned at the back in the inward direction d, among six planes of the first virtual rectangular parallelepiped 103. Moreover, the projection plane is a plane 105 at the back in the inward direction d among the planes perpendicular to the inward direction d out of planes of a smallest virtual rectangular parallelepiped 104 including a series of boundary planes. The smaller the projection plane, the more the projection time may be shortened.

Moreover, since the specific plane defining the inward direction d is any of the six planes of the first virtual rectangular parallelepiped 103, the specific plane may be specified by a user or may be specified beforehand based on an opening direction of the opening. Furthermore, the resonance frequency check apparatus 100 may, for example, project the series of boundary planes from each of the directions and set a direction in which an image obtained by the projection takes the shape of the line as the inward direction d.

Moreover, the resonance frequency check apparatus 100 provides each viewpoint in the direction of the normal vector to the plane of the first virtual rectangular parallelepiped 103, for example, and applies a parallel beam onto a series of planes from each viewpoint to project a shadow thereof onto the plane perpendicular to the inward direction d in the simulated space 101. Thus, the resonance frequency check apparatus 100 obtains a line indicated by the projected image. The line here is also referred to as a boundary line. Here, the resonance frequency check apparatus 100 specifies the shape of the opening based on the shape of the boundary line obtained by projecting only the series of boundary planes from the inward direction d while temporarily excluding the object 102 in the simulated space 101.

The resonance frequency check apparatus 100 specifies any of planes perpendicular to the inward direction d among the planes of the smallest virtual rectangular parallelepiped 104 including the series of boundary planes detected, for example. Although there are two planes perpendicular to the inward direction d, any of the two planes may be specified. Here, for example, it is assumed that any of the planes is the plane 105. For each of the sides forming the plane 105, for example, the resonance frequency check apparatus 100 projects a portion of the boundary line, in which a distance from the side meets a predetermined condition, onto the side.

Examples of the predetermined condition include a condition that the distance from the side is not more than a predetermined distance set by the user, a condition that the distance from the side is not more than a distance from the side to the central line of the plane 105, and the like. An example where the projection is performed under the condition that the distance from the side is not more than the distance from the side to the central line of the plane 105 is described with reference to FIGS. 15 and 16. Here, the line obtained by projecting a portion of the boundary line is also referred to as a peripheral line 107. Then, the resonance frequency check apparatus 100 specifies the shape type of the opening based on the shape of the peripheral line 107, for example.

The resonance frequency check apparatus 100 calculates a resonance frequency of a wave leaking through the opening, based on the specified shape type of the opening. For example, a formula capable of calculating a resonance frequency is prepared for each shape type of the opening, and when the shape type of the opening is specified, the resonance frequency check apparatus 100 calculates the resonance frequency using the formula corresponding to the shape type of the opening. In this embodiment, there are three shape types, opening, loop, and slit, for the opening. However, the embodiment is not limited thereto, but many shape types may be prepared for the opening according to a simulation result and the like. The opening has a shape such that the opening is entirely opened. The loop has a shape such that the periphery of the opening is opened. The slit has a shape such that the periphery of the opening is partially cut off.

The resonance frequency check apparatus 100 presents the calculated resonance frequency. The resonance frequency check apparatus 100 may display the resonance frequency on a display or the like in association with the opening of the object 102 in the simulated space 101, for example. Also, the resonance frequency check apparatus 100 may visualize and display the resonance frequency in association with the opening, for example. Moreover, the resonance frequency check apparatus 100 may store the resonance frequency in a storage device or the like in association with the opening, for example.

Thus, the resonance frequency of the wave leaking through the opening of the object 102 may be specified even in the middle of designing the object 102 in the simulated space 101. In a case where the object 102 is a PC having a central processing unit (CPU) or the like, for example, a leakage spot of radio wave such as which opening a radio wave emitted by the CPU will leak through may be specified if a frequency to be used by the CPU and the like are determined. Also, since the leakage spot of the radio wave may be specified even in the middle of designing the object 102, the design may be simplified such as changing the size of the opening.

Hardware Configuration Example of Resonance Frequency Check Apparatus 100

Figure 2:
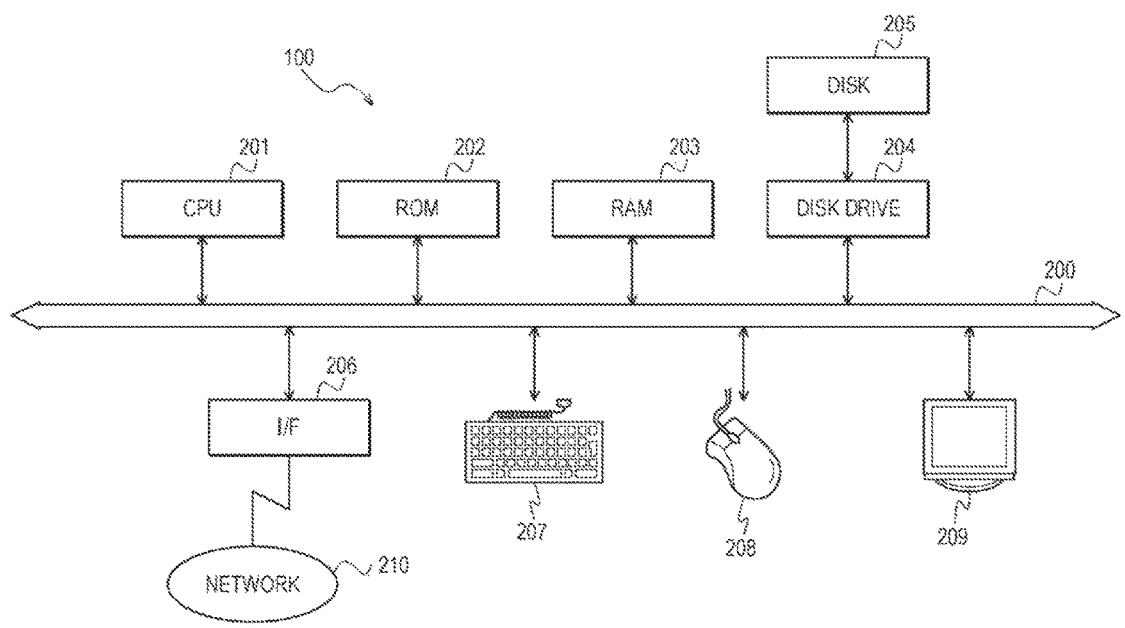
FIG. 2 is a block diagram illustrating a hardware configuration example of the resonance frequency check apparatus.

FIG. 2 is a block diagram illustrating a hardware configuration example of the resonance frequency check apparatus. In FIG. 2, the resonance frequency check apparatus 100 includes a CPU 201, a read only memory (ROM) 202, a random access memory (RAM) 203, a disk drive 204, and a disk 205. The resonance frequency check apparatus 100 further includes an Inter/Face (I/F) 206, a keyboard 207, a mouse 208, and a display 209. Also, the CPU 201, the ROM 202, the RAM 203, the disk drive 204, the I/F 206, the keyboard 207, the mouse 208, and the display 209 are connected to each other through a bus 200.

Here, the CPU 201 controls the entire resonance frequency check apparatus 100. The ROM 202 stores programs such as a boot program. The RAM 203 is used as a work area for the CPU 201. The disk drive 204 controls read/write of data from/to the disk 205 under the control of the CPU 201. The disk 205 stores data written by the control of the disk drive 204. Examples of the disk 205 include a magnetic disk, an optical disk, and the like.

The I/F 206 is connected to a network 210, such as a local area network (LAN), a wide area network (WAN), and the Internet, through a communication line, and is connected to another apparatus through the network 210. The I/F 206 serves as an interface between the network 210 and the inside, and controls input and output of data to and from an external apparatus. A modem, a LAN adapter or the like, for example, may be adopted as the I/F 206.

The keyboard 207 and the mouse 208 are interfaces operated by the user to input various data. The display 209 is an interface for outputting data according to an instruction of the CPU 201.

Although not illustrated, the resonance frequency check apparatus 100 may be provided with an input device to take in images and videos from a camera or an input device to take in voices from a microphone. Also, although not illustrated, the resonance frequency check apparatus 100 may be provided with an output device such as a printer.

Moreover, in this embodiment, a personal computer is described as an example of the hardware configuration of the resonance frequency check apparatus 100. However, the embodiment is not limited thereto, but a server or the like may be adopted. When the resonance frequency check apparatus 100 is the server, an apparatus which may be operated by the resonance frequency check apparatus 100 and the user, the display 209, and the like may be connected to each other through the network 210.

Although not illustrated, the resonance frequency check apparatus 100 may be provided with an input device to take in images and videos from a camera or an input device to take in voices from a microphone. Also, although not illustrated, the resonance frequency check apparatus 100 may be provided with an output device such as a printer. Moreover, although not illustrated, the resonance frequency check apparatus 100 may be provided with a solid state drive (SSD), a flash ROM or the like, for example.

Alternatively, the resonance frequency check apparatus 100 may not include the disk drive 204, the disk 205, and the like, for example, among the components described above.

Functional Configuration Example of Resonance Frequency Check Apparatus 100

Figure 3:
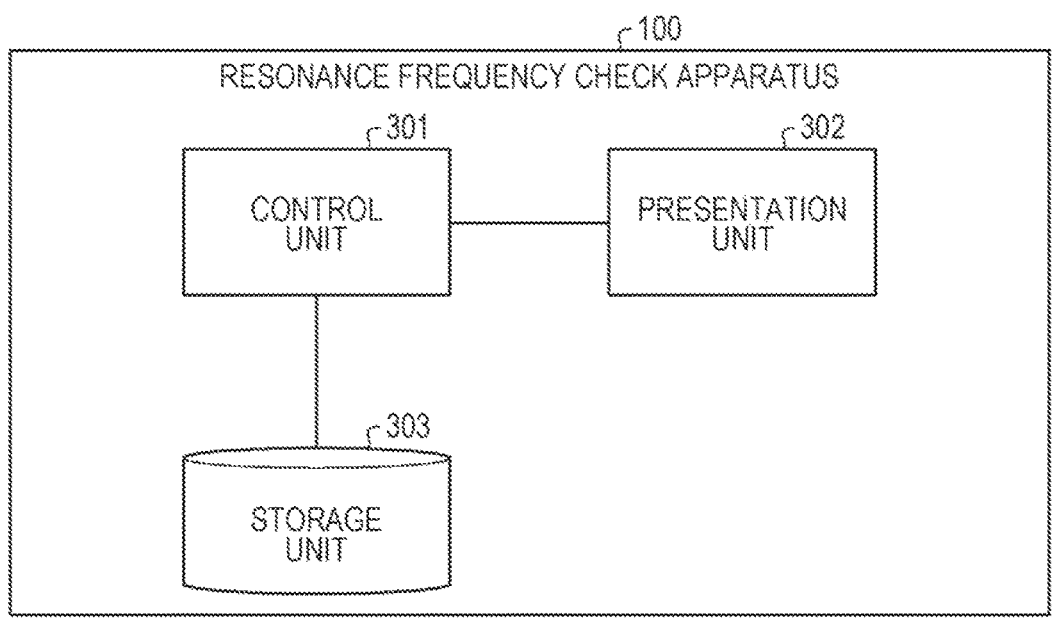
FIG. 3 is a block diagram illustrating a functional configuration example of the resonance frequency check apparatus.

FIG. 3 is a block diagram illustrating a functional configuration example of the resonance frequency check apparatus. The resonance frequency check apparatus 100 includes a control unit 301, a presentation unit 302, and a storage unit 303. Processing by the control unit 301 is coded in a program stored in the storage unit 303 such as the ROM 202, the RAM 203, and the disk 205, which may be accessed by the CPU 201 illustrated in FIG. 2, for example. Then, the CPU 201 reads the program from the storage unit 303 and executes the processing coded in the program. Thus, the processing by the control unit 301 is realized.

The result of the processing by the control unit 301 is stored in the storage unit 303 such as the RAM 203, the ROM 202, and the disk 205, for example. Moreover, the control unit 301 may execute CAD or the like capable of arranging the object 102 in the simulated space 101, for example. The presentation unit 302 is realized by the display 209 or the like, for example, and displays a screen and the like according to an instruction of the control unit 301.

Figure 4:
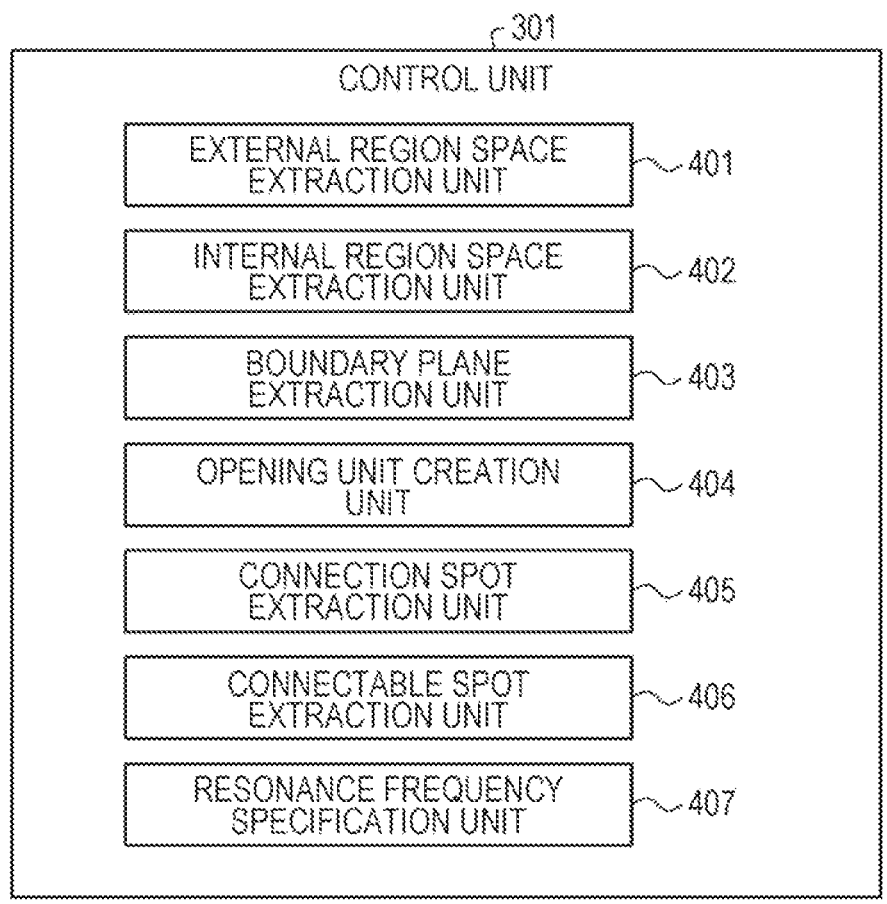
FIG. 4 is an explanatory diagram illustrating a detailed example of a control unit.
Figure 5:
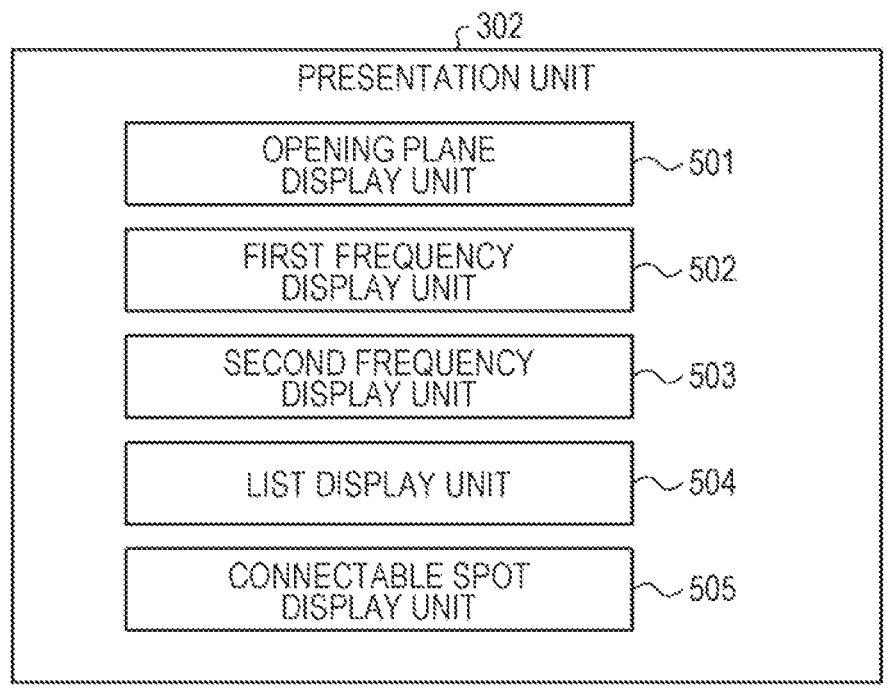
FIG. 5 is an explanatory diagram illustrating a detailed example of a presentation unit.

The control unit 301 performs processing of creating an external region space, processing of creating an internal region space, processing of creating a boundary plane, processing of sorting by the opening, processing of specifying a resonance frequency by the opening, and the like. FIG. 4 illustrates a detailed example of the control unit 301. FIG. 5 illustrates a detailed example of the presentation unit 302. FIG. 6 illustrates a detailed example of the storage unit 303.

FIG. 4 is an explanatory diagram illustrating a detailed example of the control unit. The control unit 301 includes an external region space extraction unit 401, an internal region space extraction unit 402, a boundary plane extraction unit 403, an opening unit creation unit 404, a connection spot extraction unit 405, a connectable spot extraction unit 406, and a resonance frequency specification unit 407. The external region space extraction unit 401, the internal region space extraction unit 402, the boundary plane extraction unit 403, and the opening unit creation unit 404 are the conventional technique (see, for example, Japanese Laid-open Patent Publication No. 2015-114728 aforementioned).

FIG. 5 is an explanatory diagram illustrating a detailed example of the presentation unit. The presentation unit 302 includes an opening plane display unit 501, a first frequency display unit 502, a second frequency display unit 503, a list display unit 504, and a connectable spot display unit 505.

Figure 9:
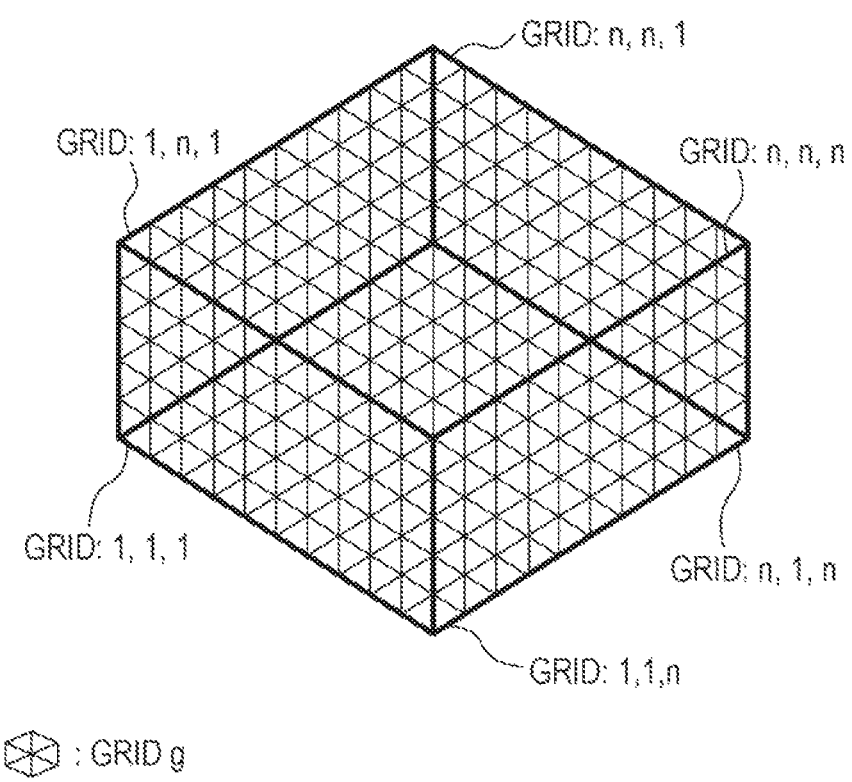
FIG. 9 is an explanatory diagram illustrating a grid example.

FIG. 6 is an explanatory diagram illustrating a detailed example of the storage unit. The storage unit 303 includes component information 601, grid information 602, and the like, for example. Also, the storage unit 303 stores results of processing by the control unit 301 and the presentation unit 302, and the like. FIG. 7 illustrates a detailed example of the component information 601. FIG. 9 illustrates an example of the grids g. FIG. 10 illustrates a detailed example of the grid information 602.

FIG. 7 is an explanatory diagram illustrating a stored content example of the component information. The component information 601 is information for displaying the object 102 to be designed on the simulated space 101, and is information indicating the respective components included in the object 102 to be designed. The component information 601 includes fields such as component ID, shape, position, and conductivity, for example. Information is set in each of the fields, and is stored as a record (for example, 700-1 or the like). Also, although not illustrated, the component information 601 may include color information or the like.

In the field of component ID, identification information capable of uniquely specifying each of the components is set. In the field of shape, information indicating the shape of the component is set. In the field of position, information indicating the position of the component is set. In the simulated space 101, a three-dimensional orthogonal coordinate system having x-axis, y-axis, and z-axis is defined. In the field of conductivity, presence or absence of conductivity is set.

Referring back to FIG. 4, processing by the external region space extraction unit 401 is described. As described above, processing by the external region space extraction unit 401, the internal region space extraction unit 402, the boundary plane extraction unit 403, and the opening unit creation unit 404 is the conventional technique (see, for example, Japanese Laid-open Patent Publication No. 2015-114728 aforementioned), and thus is briefly described here.

While cubes, virtual rectangular parallelepipeds, region spaces, and the like are provided thereafter in the simulated space, vertex information indicating vertexes of the cubes, virtual rectangular parallelepipeds, region spaces, and the like, for example, or the like is actually created.

First, the external region space extraction unit 401 extracts an external region space between the object 102 disposed in the simulated space 101 and the contact with the shape of the object 102 from planes SF in directions opposite to directions normal to the planes SF. The planes SF are respective planes internally containing the object 102 in a smallest virtual rectangular parallelepiped. The types of the virtual rectangular parallelepiped include a cube. To be more specific, the external region space extraction unit 401 generates virtual rectangular parallelepiped information indicating the smallest virtual rectangular parallelepiped 104 that comes into contact with the object 102 and includes the object 102.

Figure 8:
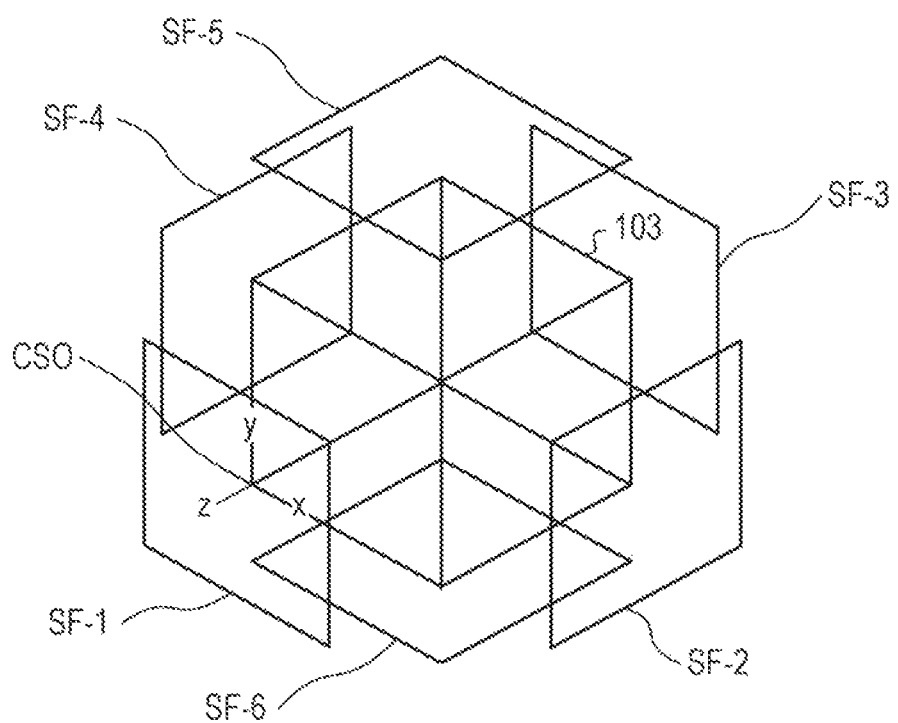
FIG. 8 is an explanatory diagram illustrating an example of a first virtual rectangular parallelepiped and planes of the first virtual rectangular parallelepiped.

FIG. 8 is an explanatory diagram illustrating an example of a first virtual rectangular parallelepiped and planes of the first virtual rectangular parallelepiped. In the simulated space 101, as described above, a reference coordinate system of x, y, and z is defined based on the first virtual rectangular parallelepiped 103. The first virtual rectangular parallelepiped 103 is formed of planes SF-1 to SF-6.

Next, the external region space extraction unit 401 generates the grid information 602 indicating a plurality of grids g obtained by dividing the first virtual rectangular parallelepiped 103 indicated by the virtual rectangular parallelepiped information into pieces of a predetermined size.

FIG. 9 is an explanatory diagram illustrating a grid example. FIG. 10 is an explanatory diagram illustrating a grid information example. As illustrated in FIG. 9, the first virtual rectangular parallelepiped 103 is divided into a plurality of grids g. The grid information 602 is information which may be set in the respective grids g. The grid information 602 includes fields of grid position, grid attribute, conductivity, and plane. Information is set in the respective fields, and is stored as records (for example, 1000-1 to 1000-6 or the like) corresponding to the grids g.

In the field of grid position, coordinates based on the defined coordinate system are set as described above. In the field of grid attribute, information indicating which attributes the respective grids g have is set. The attributes include component, external region space to be described later, internal region space to be described later, internal gap region to be described later, boundary region to be described later, and opening region to be described later. In the field of component type, information indicating the type of the component whose position overlaps with the grid g is set for the grid g whose grid attribute is component. In the field of conductivity, whether or not the component whose position overlaps with the grid g is conductive is set for the grid g whose grid attribute is component. In the field of plane, whether or not each of the six planes forming the grid g is any of the component boundary, boundary and opening is set. If each plane is not any of the above, "-" is set. The six planes include Xmin plane, Xmax plane, Ymin plane, Ymax plane, Zmin plane, and Zmax plane.

Next, the external region space extraction unit 401 illustrated in FIG. 4 sequentially selects one plane SF from the plurality of planes SF. The external region space extraction unit 401 sequentially selects the grids g in contact with the selected plane SF. Then, the external region space extraction unit 401 extracts the grids g not overlapping with the component between the selected grid g and the grid g at least partially overlapping with the component in the inward direction d, among the plurality of grids g, as the external region space. The extraction result is set in the field of grid attribute in the grid information 602. As described above, the inward direction d is opposite to a direction of a normal vector to the plane SF.

Then, the external region space extraction unit 401 extracts the first grid g at least partially overlapping with the component in the inward direction d from the selected grid g as an external component region. The extraction result is set in the field of grid attribute in the grid information 602. Moreover, the external region space extraction unit 401 extracts information indicating whether or not the component at least partially overlapping with the extracted external component region is conductive, based on the component information 601. The extraction result is set in the field of grid attribute in the grid information 602 and in the field of conductivity in the grid information 602.

Next, for each of the grids g yet to be extracted, the internal region space extraction unit 402 determines whether or not there is a component at least partially overlapping with the grid g, based on the component information 601. Then, the internal region space extraction unit 402 extracts the grids g overlapping with no component as the internal region space. The extraction result is set in the field of grid attribute in the grid information 602.

The internal region space extraction unit 402 extracts the grids g overlapping with a component as a component region. Also, the internal region space extraction unit 402 extracts information indicating whether or not the component overlapping with the grid g extracted as a component region pa is conductive, based on the component information 601. The extraction result is set in the field of grid attribute in the grid information 602 and in the field of conductivity in the grid information 602.

The boundary plane extraction unit 403 extracts a contact plane that comes into contact with the plane in the external region space, among the planes in the internal region space, as a boundary plane. The extraction result is set in the field of plane in the grid information 602. Also, the extraction result is stored as boundary plane information.

FIG. 11 is an explanatory diagram illustrating a stored content example of the boundary plane information. Boundary plane information 1100 is information indicating the extracted boundary planes. The boundary plane information 1100 includes fields such as boundary plane ID, grid position, and direction, for example. Information is set in the respective fields, and is stored as a record (for example, 1101-1 or the like).

In the field of boundary plane ID, identification information capable of uniquely specifying the boundary plane is set. In the field of grid position, coordinate values of vertexes of the grids g included in the boundary plane are set. In the field of direction, a direction of the plane in the grid g is set.

The opening unit creation unit 404 illustrated in FIG. 4 selects any of the extracted boundary planes. The opening unit creation unit 404 records the selected boundary plane as a new opening. Next, the opening unit creation unit 404 selects a boundary plane adjacent to the selected boundary plane. Then, the opening unit creation unit 404 records the selected boundary plane and the selected adjacent boundary plane as the same opening. Thereafter, the opening unit creation unit 404 selects a boundary plane adjacent to any of the plurality of boundary planes recorded as the same opening. Subsequently, the opening unit creation unit 404 records the newly selected boundary plane as the same opening as the plurality of boundary planes in the storage unit 303. The opening unit creation unit 404 stores information about the opening as opening information in the storage unit 303, for example. As described above, the opening unit creation unit 404 may specify a series of boundary planes as the opening by tracking the adjacent boundary planes from the selected boundary plane.

FIG. 12 is an explanatory diagram illustrating a stored content example of the opening information. Opening information 1200 is information about the opening. The opening information 1200 includes fields such as opening ID, opening position coordinate, boundary plane ID, and opening direction, for example. Information is set in the respective fields, and is stored as a record (for example, 1201-1 or the like).

In the field of opening ID, identification information capable of uniquely specifying the opening is set. In the field of opening position coordinate, the minimum and maximum coordinate values of the opening are set. In the field of boundary plane ID, identification information of a series of boundary planes included in the opening is set. In the field of opening direction, the opening direction of the opening is set.

Figure 13:
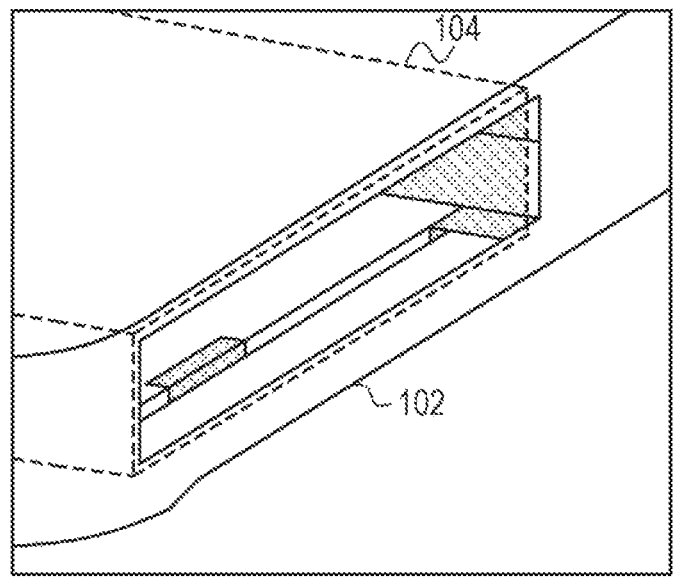
FIG. 13 is an explanatory diagram illustrating a display example of a boundary plane included in an opening.

FIG. 13 is an explanatory diagram illustrating a display example of the boundary plane included in the opening. FIG. 13 illustrates an example where the boundary plane included in the opening of the object 102 is displayed in the simulated space 101. In the example of FIG. 13, a shaded portion of the object 102 represents the boundary plane. Also, the dotted lines indicate the smallest virtual rectangular parallelepiped 104 including the opening for each opening.

The resonance frequency specification unit 407 illustrated in FIG. 4 sequentially selects an opening, for which the resonance frequency is to be extracted, from among the specified openings, for example. The resonance frequency specification unit 407 obtains a boundary line 106 by projecting a series of boundary planes included in the selected opening in the inward direction d, for example.

Then, the resonance frequency specification unit 407 specifies a plane 105 perpendicular to the inward direction d among the planes of the smallest virtual rectangular parallelepiped 104 including the boundary plane included in the opening. Here, the plane on the opening side in the opening is assumed to be the plane 105. The smallest virtual rectangular parallelepiped 104 including the boundary plane is the smallest virtual rectangular parallelepiped 104 including the maximum shape of the boundary plane, for example.

For each of the sides of the specified plane 105, the resonance frequency specification unit 407 projects a portion of the boundary line 106 in which a distance from the side of the specified plane 105 meets a predetermined condition. The predetermined condition may be within a predetermined distance from the side of the specified plane or may be between the side of the specified plane and the central line of the specified plane.

Figure 14:
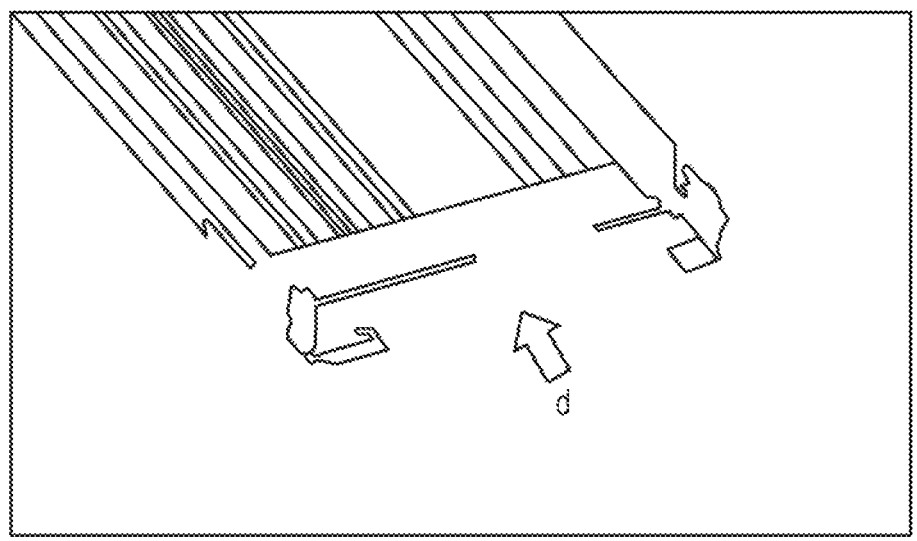
FIG. 14 is an explanatory diagram illustrating only the boundary plane.

FIG. 14 is an explanatory diagram illustrating only the boundary plane. FIG. 14 illustrates an example of displaying only the boundary plane included in the opening. The arrow indicates the inward direction d of the first virtual rectangular parallelepiped 103. The first virtual rectangular parallelepiped 103 is the smallest virtual rectangular parallelepiped internally containing the object 102.

Figure 15:
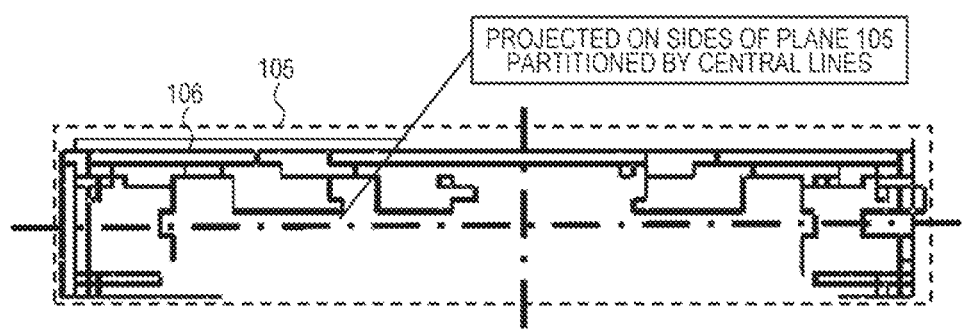
FIG. 15 is an explanatory diagram illustrating a projection example of the boundary plane.

FIG. 15 is an explanatory diagram illustrating a projection example of the boundary plane. The resonance frequency specification unit 407 projects the boundary line 106 on the sides of the specified plane 105 partitioned by the respective central lines of the specified plane 105. For example, there is the boundary line 106 for the upper left region of the plane, but there is no boundary line 106 for the lower left region. The resonance frequency specification unit 407 determines whether or not the boundary line 106 is present on each of the regions of the plane 105 partitioned by the central lines of the plane 105, and obtains a peripheral line 107 in which the boundary line 106 determined as present is projected along the entire sides of the plane 15.

Figure 16:
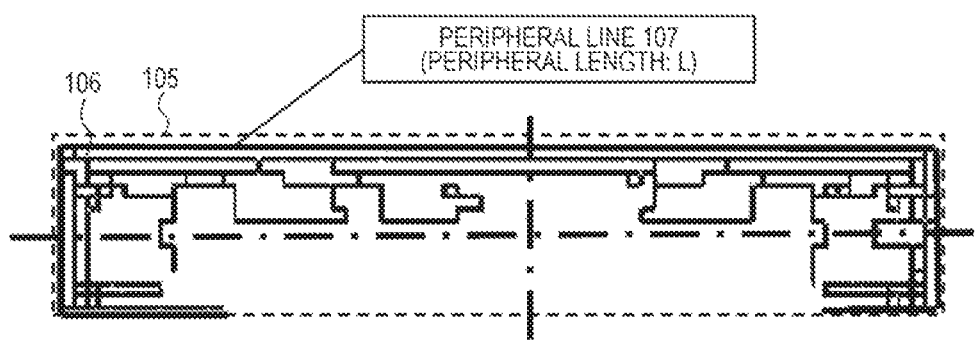
FIG. 16 is an explanatory diagram illustrating an example of a peripheral line.

FIG. 16 is an explanatory diagram illustrating an example of the peripheral line. FIG. 16 illustrates the peripheral line 107 obtained by projecting the plane 105. The resonance frequency specification unit 407 specifies the shape type of the opening as a slit when the peripheral line 107 is disconnected without making a circuit. In the example of FIG. 16, the shape type of the opening is the slit. When the peripheral line 107 makes a circuit, the resonance frequency specification unit 407 sets the plane 105 as an opening plane and a portion of the opening plane, which is included in the component, as a component plane in the simulated space 101.

Then, the resonance frequency specification unit 407 determines whether or not there is a hole in a loop that is the opening based on whether or not an area ratio of the component plane to the opening plane is not less than a threshold. The threshold may be set by the user, for example, and is 70 to 80 percent in this embodiment.

Figure 17:
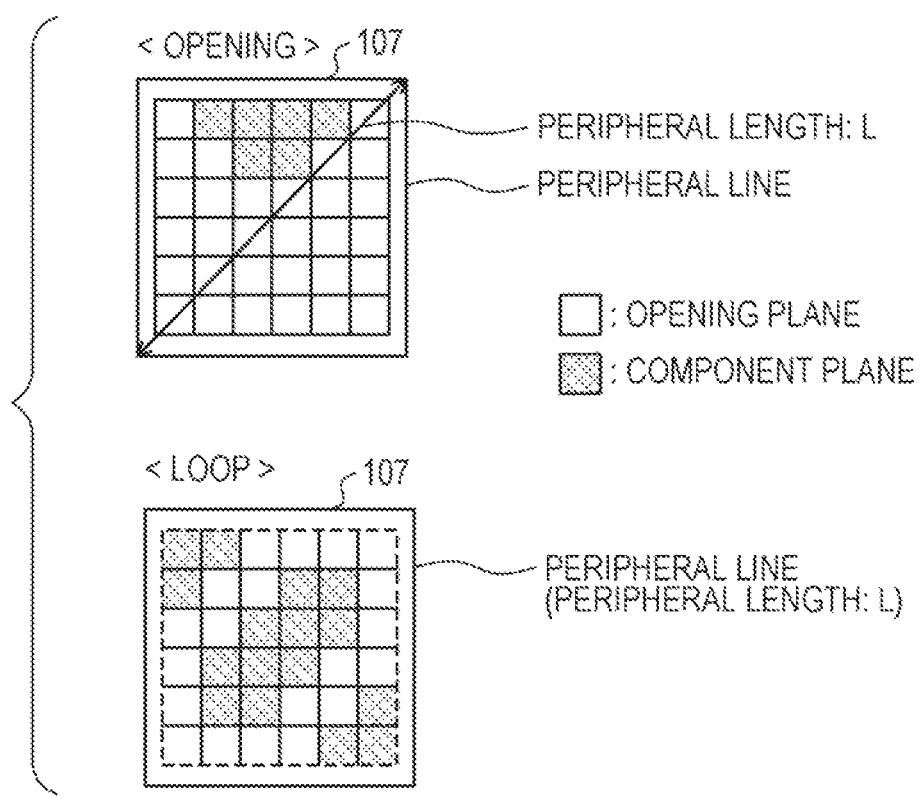
FIG. 17 is an explanatory diagram illustrating an example when the shape type of the opening is an opening and is a loop.

FIG. 17 is an explanatory diagram illustrating an example when the shape type of the opening is an opening and is a loop. When the area ratio of the component plane is less than 70 percent, for example, the resonance frequency specification unit 407 specifies the shape type of the opening as the opening since the shape of the opening is not a hole like a loop. When the area ratio of the component plane is 70 percent or more, for example, the resonance frequency specification unit 407 specifies the shape type of the opening as the loop since the shape of the opening is a hole like a loop.

When the shape type of the opening is the opening, for example, the resonance frequency specification unit 407 calculates a resonance frequency according to the following equation (1) where L is the length of the diagonal line of the opening plane. When the shape type of the opening is the loop, for example, the resonance frequency specification unit 407 calculates a resonance frequency according to the following equation (2) where L is a peripheral length. When the shape type of the opening is the slit, for example, the resonance frequency specification unit 407 calculates a resonance frequency according to the following equation (3) where L is the peripheral length.

$$F = C/2L \qquad (1)$$

$$F = C/L \qquad (2)$$

$$F = C/2L \qquad (3)$$

Here, in the above equations (1) to (3), C is a light speed (3E+8) m/s. F is the resonance frequency. As for the shape type of each opening, an example of the above equations and L is described.

Figure 18:
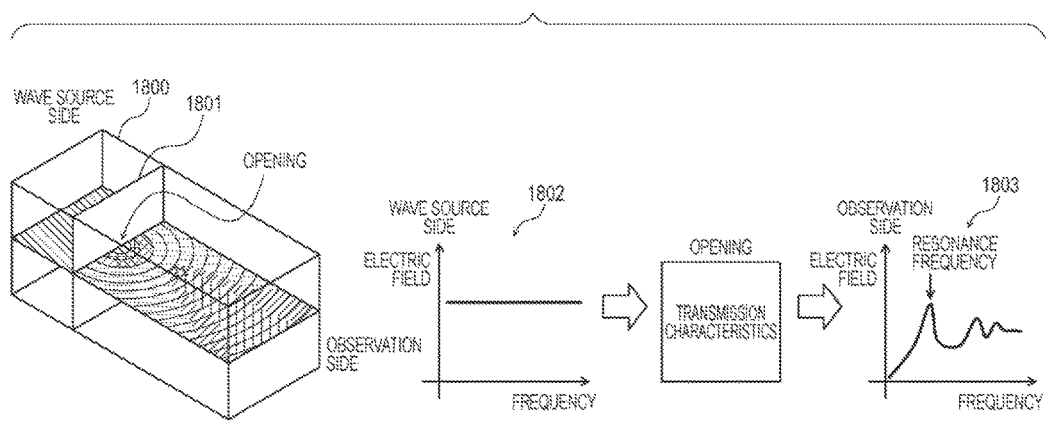
FIG. 18 is an explanatory diagram illustrating a simulation example of obtaining a relationship between the shape of the opening and the resonance frequency.

FIG. 18 is an explanatory diagram illustrating a simulation example of obtaining a relationship between the shape of the opening and the resonance frequency. In the simulated space 101, a simulation is conducted such that an analysis region 1800 is divided into two spaces by a metal wall 1801 and a wave source is disposed in one of the spaces. Then, frequency characteristics of an electric field in which the wave source leaks to the other space are calculated. A graph 1802 illustrates a simulation example where the electric field is fixed and the frequency is changed on the wave source side.

A graph 1802 illustrates a relationship between the electric field and the frequency for the position denoted by an asterisk in the observation-side space. In the graph 1803, a frequency with the largest electric field is the resonance frequency.

Next, description is given of an example where the above equations (1) to (3) are obtained based on the relationship between the electric field and the resonance frequency according to the shape of each opening.

Figure 19:
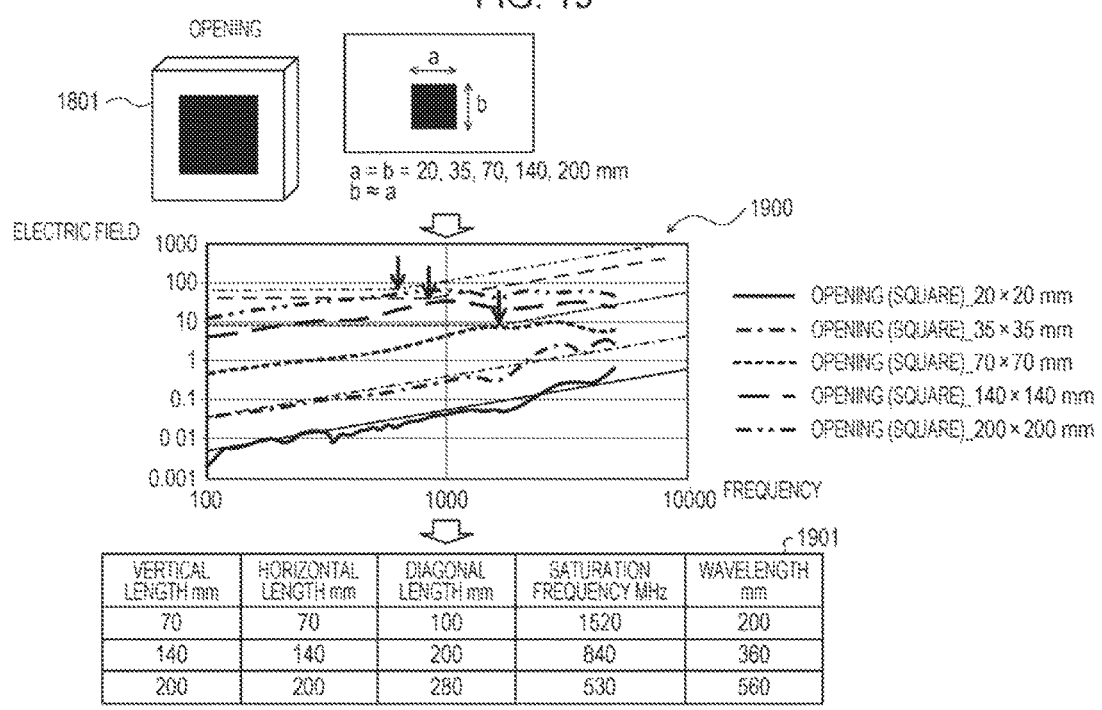
FIG. 19 is an explanatory diagram illustrating the resonance frequency when the shape type of the opening is the opening.

FIG. 19 is an explanatory diagram illustrating the resonance frequency when the shape type of the opening is the opening. A graph 1900 illustrates a relationship between the electric field and the frequency when lengths of a side a and a side b of the opening are set to 20, 35, 70, 140, and 200 mm. In the graph 1900, the vertical axis represents the electric field and the horizontal axis represents the frequency. The positions indicated by the respective arrows in the graph 1900 are change points of the frequency, and the frequency at the position of each arrow is the resonance frequency. When the area of the opening is large, a leaking wave is not limited to that at a specific frequency, but waves of a wide range of frequencies leak. Also, when the size of the opening becomes larger than a certain size, such as 70×70 mm, 140×140 mm, and 200×200 mm, the electric field at lower frequencies is not reduced.

A table 1901 illustrates a diagonal length, a saturation frequency and a wavelength at the length of each side. According to the table 1901, when the shape type of the opening is the opening, the diagonal length of the opening is a value close to "wavelength/2". Therefore, since the resonance frequency is "light speed/wavelength", an equation in which a value twice as large as the diagonal length is assigned to the wavelength in "light speed/wavelength" is the equation (1).

Figure 20:
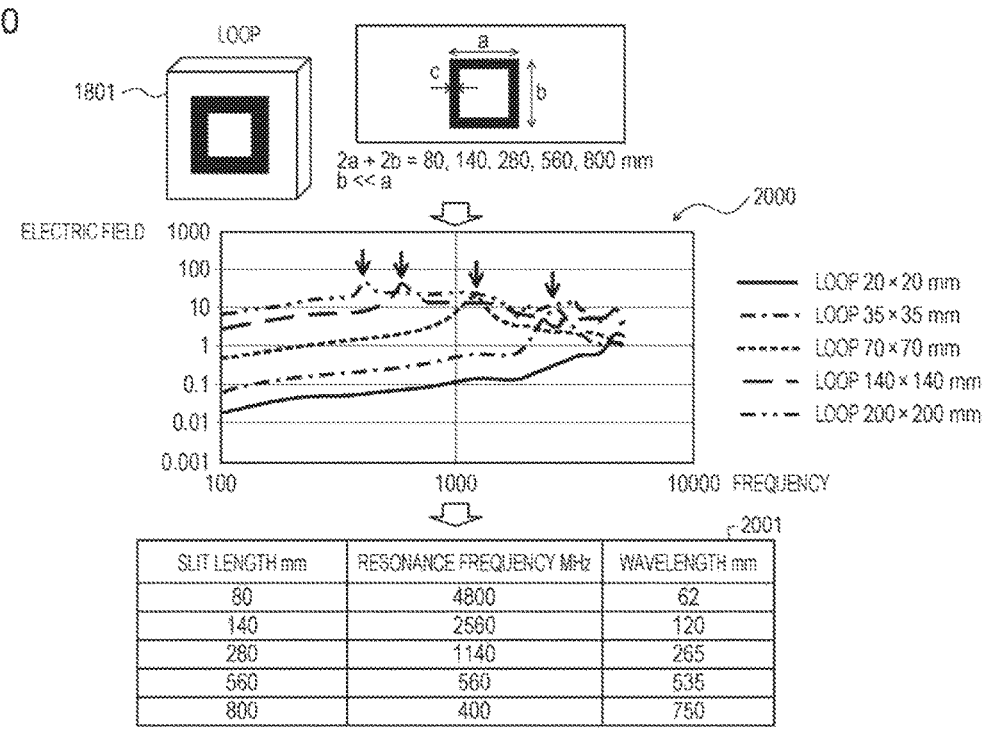
FIG. 20 is an explanatory diagram illustrating the resonance frequency when the shape type of the opening is the loop.

FIG. 20 is an explanatory diagram illustrating the resonance frequency when the shape type of the opening is the loop. The slit length is 2a+2b. A graph 2000 illustrates a relationship between the electric field and the frequency when the slit length is set to 80, 140, 280, 560, and 800. In the graph 2000, the vertical axis represents the electric field and the horizontal axis represents the frequency. When the side a and the side b are 20 mm, for example, the slit length is 80 mm.

The positions indicated by the respective arrows in the graph 2000 are change points of the frequency, and the frequency at the position of each arrow is the resonance frequency. In a table 2001, when the slit length is 80 mm, the resonance frequency is 4800 MHz and the wavelength is 62 mm. Also, in the table 2001, when the slit length is 140 mm, the resonance frequency is 2560 MHz and the wavelength is 120 mm.

As described above, the slit length of the opening is a value close to "wavelength". Therefore, since the resonance frequency is "light speed/wavelength", an equation with the slit length assigned to the wavelength in "light speed/wavelength" is the equation (2).

Figure 21:
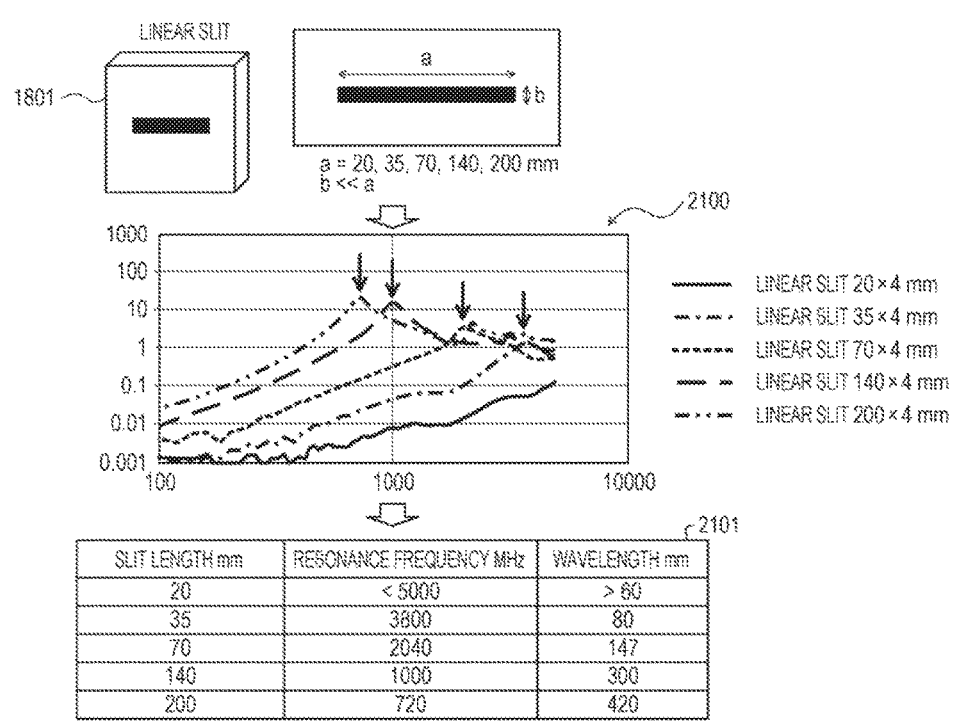
FIG. 21 is an explanatory diagram (Part 1) illustrating the resonance frequency when the shape type of the opening is the slit.
Figure 22:
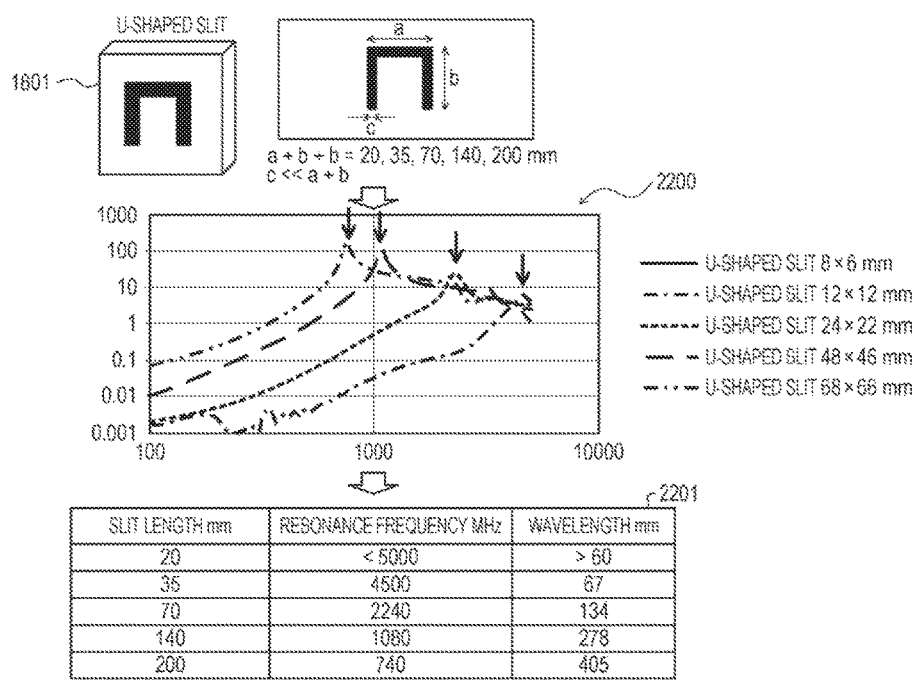
FIG. 22 is an explanatory diagram (Part 2) illustrating the resonance frequency when the shape type of the opening is the slit.

FIGS. 21 and 22 are explanatory diagrams illustrating the resonance frequency when the shape type of the opening is the slit. As illustrated in FIG. 21, in the case of a linear slit, a graph 2100 illustrates a relationship between the electric field and the frequency when the length of the side a of the slit is set to 20, 35, 70, 140, and 200 mm, for example. As illustrated in FIG. 22, in the case of a U-shaped slit, a graph 2200 illustrates a relationship between the electric field and the frequency when the total length of the sides a+b+b of the slit is set to 20, 35, 70, 140, and 200 mm, for example.

When the length of the side a is 8 and the length of the side b is 6, for example, the slit length is 8+6+6=20. When the length of the side a is 12 and the length of the side b is 12, for example, the slit length is 12+12+12=36, which is about 35. The positions indicated by the respective arrows in the graph are change points of the frequency, and the frequency at the position of each arrow is the resonance frequency.

In a table 2101 illustrated in FIG. 21, the slit length is a value which is about half the peripheral length of the slit and close to a value half the wavelength. Also, in a table 2201 illustrated in FIG. 22, the slit length is a value close to the value half the wavelength. Therefore, since the resonance frequency is light speed/wavelength, an equation in which a value twice as large as the slit length is assigned to the wavelength is the equation (3).

As described above with reference to FIGS. 19 to 22, the above equations (1) to (3) are obtained. Thus, the equations capable of specifying the resonance frequency are obtained for every shape type of the opening. Although the number of the shape types of the opening is three in this embodiment, the embodiment is not limited thereto.

Referring back to FIG. 4, the resonance frequency specification unit 407 specifies the resonance frequency according to the equation corresponding to the type.

Also, the connection spot extraction unit 405 extracts a position where the components included in the smallest virtual rectangular parallelepiped 104 interfere with each other among the plurality of components included in the object 102 in the simulated space 101, for example. The interference between the components means overlapping or contact between the components. The position where the components interfere with each other is also referred to as a connection spot. Also, the connection spot extraction unit 405 stores the extracted connection spot in opening type information to be described later, for example.

Figure 23:
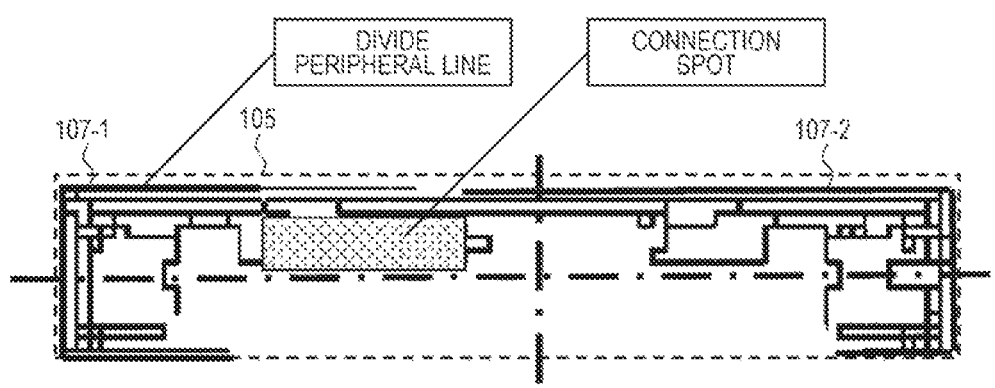
FIG. 23 is an explanatory diagram illustrating an example of a peripheral line of the boundary plane including a connection spot.

FIG. 23 is an explanatory diagram illustrating an example of the peripheral line of the boundary plane including the connection spot. The resonance frequency specification unit 407 deletes a line for the connection spot from the peripheral line 107. Thus, the peripheral line 107 is divided into a peripheral line 107-1 and a peripheral line 107-2. Therefore, since the projected peripheral line 107 is divided depending on the intersection or connection spot, the shape type may be determined as a slit rather than a loop.

The resonance frequency specification unit 407 specifies the shape type of the opening based on the divided peripheral line 107, and calculates the resonance frequency according to the specified type. Here, when the peripheral line is divided, the resonance frequency specification unit 407 calculates the resonance frequency by substituting the total length of the plurality of divided peripheral lines 107 as L into the equation (3). The resonance frequency specification unit 407 stores the specified resonance frequency in the opening type information. Also, the resonance frequency specification unit 407 may generate the boundary line 106 by excluding each position corresponding to the extracted connection spot from the boundary line 106, for example. Then, the resonance frequency specification unit 407 may obtain the peripheral line 107 by projecting the excluded boundary line 106 as described above, for example.

FIG. 24 is an explanatory diagram illustrating an opening type information example. Opening type information 2400 includes fields of opening ID, peripheral line length, type, type-by-type peripheral length, resonance frequency, connection spot, and connection position. Information is set in the respective fields, and is stored as a record (for example, 2401-1 or the like).

In the field of opening ID, identification information capable of uniquely identifying the opening is set. In the field of peripheral line length, the length of the peripheral line 107 specified for the opening is set. In the field of type, the shape type of the opening specified based on the peripheral line 107 is set.

In the field of type-by-type peripheral length, the peripheral length corresponding to the specified shape type of the opening is set. As described above, when the shape type of the opening is the opening, the peripheral length is the length of the diagonal line. When the shape type of the opening is the loop or slit, the peripheral length is the length of the peripheral line 107.

In the field of resonance frequency, the specified resonance frequency is set. In the field of connection spot, information indicating whether or not the connection spot specified by the user is reflected is set. When the connection spot is reflected, "reflected" is set. On the other hand, when the connection spot is not reflected, "not reflected" is set. In the field of connection position, the position of the extracted connection spot is set.

Moreover, in the object 102 in the simulated space 101, if the components around the opening are spatially close to each other, for example, the components may be electrically connected to each other. Such electrical connection enables the shape of the opening to be changed such as reducing the shape of the opening in size.

Therefore, the connectable spot extraction unit 406 extracts a combination of a plane of a first component within a first predetermined distance from each plane of the smallest virtual rectangular parallelepiped 104 and a plane of a second component whose distance from the plane of the first component is within a second predetermined distance among planes of a component different from the first component. The first predetermined distance and the second predetermined distance may be set by the user, for example, and stored in the storage unit 303 or the like. Each of the positions from the plane of the first component included in the extracted combination to the plane of the second component included in the extracted combination is the connectable spot. Here, the first component and the second component are conductive components. Whether or not the components are conductive may be specified based on the component information 601.

To be more specific, for each of the planes of the virtual rectangular parallelepiped 104, for example, the connectable spot extraction unit 406 selects the plane of the component based on a shortest distance between the plane of the virtual rectangular parallelepiped 104 and the plane of the component included in the object 102. Thus, the plane of the component close to the plane of the virtual rectangular parallelepiped 104 may be selected. The component selected here is a target component.

When the shortest distance between the plane of the selected target component and a plane of a component different from the target component is within the second predetermined distance, the connectable spot extraction unit 406 extracts a combination of the plane of the target component and the plane of the component different from the target component. Thus, a combination of the plane of the target component close to the opening and a plane of a component closest to the plane of the target component is extracted.

Figure 25:
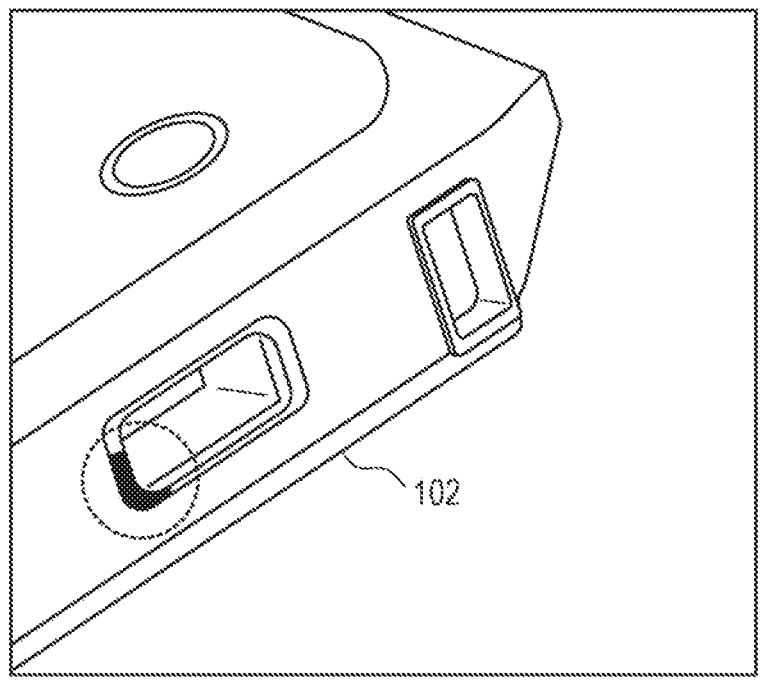
FIG. 25 is an explanatory diagram illustrating an example of displaying a connectable spot.

FIG. 25 is an explanatory diagram illustrating an example of displaying a connectable spot. The connectable spot display unit 505 displays the connectable spot on the display 209 or the like while highlighting the connectable spot when displaying the object 102 on the display 209 or the like. In the example of FIG. 25, an opening into which a Universal Serial Bus (USB) connector may be inserted has a connectable spot at a position indicated by the dotted circle.

Figure 26:
FIG. 26 is an explanatory diagram illustrating an example of displaying a selected connectable spot.

FIG. 26 is an explanatory diagram illustrating an example of displaying the selected connectable spot. The connectable spot display unit 505 illustrated in FIG. 5 displays a list of connectable spots for each target component as illustrated in FIG. 26. The connectable spot display unit 505 displays identification information of the target component and identification information of a counterpart component having a plane combined with a target plane of the target component in association with each other for each target component.

Then, the connectable spot display unit 505 displays a list of plane IDs, counterpart plane IDs and clearances for the target components selected by the user. The plane ID represents a target plane included in the target component, which may be highlighted. The counterpart plane ID represents a counterpart plane to be combined with the target plane represented by the plane ID. The clearance is the shortest distance between the target plane represented by the plane ID and the plane represented by the counterpart plane ID. The user uses the input device such as the keyboard 207 and the mouse 208 to select the plane ID representing the target plane to be highlighted.

Then, when the object 102 disposed in the simulated space 101 is displayed, the connectable spot display unit 505 highlights and displays the target plane represented by the plane ID selected by the user.

The resonance frequency specification unit 407 specifies the shape type of the opening based on the shape of the peripheral line 107 obtained by excluding a line corresponding to a position from the plane of the first component included in the extracted combination to the plane of the second component included in the extracted combination. The resonance frequency specification unit 407 specifies the shape type of the opening by performing deletion as in the case of the connection spot, and thus detailed description thereof is omitted. Also, the resonance frequency specification unit 407 may generate a boundary line 106 by excluding a line corresponding to a position from the plane of the first component included in the extracted combination to the plane of the second component included in the extracted combination from the boundary line 106, for example. Then, the resonance frequency specification unit 407 may obtain the peripheral line 107 by projecting the excluded boundary line 106 as described above, for example.

FIG. 27 is an explanatory diagram illustrating a list display example of the resonance frequency. The list display unit 504 displays a list of resonance frequencies of the openings, for example. The list display unit 504 displays a list of the numbers of openings and the shape types of the openings by the frequency, for example. In the example of FIG. 27, when the resonance frequency is 100 MHz, the number of openings is 4 and the composition of the shape types of the openings includes one slit, two loops and one opening.

Also, the list display unit 504 may display individual spots of the specified resonance frequency, for example. The list display unit 504 displays the peripheral length, the location in the first virtual rectangular parallelepiped 103, and the shape type of the opening, for example. In the example of FIG. 27, the list display unit 504 displays individual spots for the case of 100 MHz. The resonance frequencies to be displayed may be specified by the user using the input device such as the keyboard 207 and the mouse 208.

Figure 28:
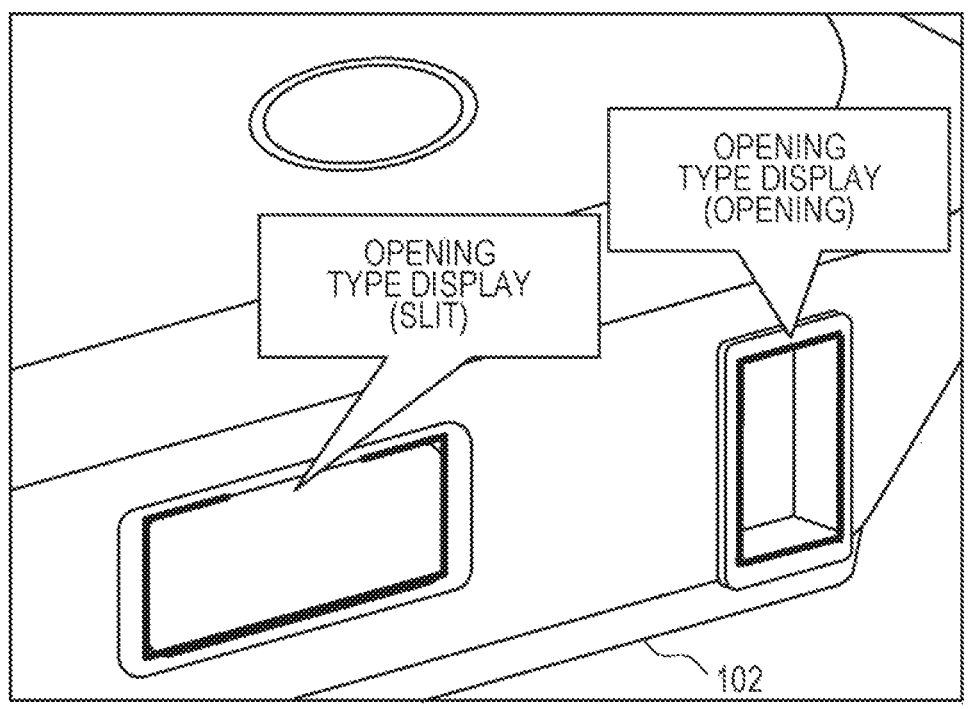
FIG. 28 is an explanatory diagram illustrating an opening plane display example of the openings.

FIG. 28 is an explanatory diagram illustrating an opening plane display example of the openings. The opening plane display unit 501 displays opening planes of openings. Also, the opening plane display unit 501 highlights and displays the opening planes of the openings in the object 102 in the simulated space 101, for example. The opening plane display unit 501 may highlight and display the opening planes so that the specified shape types of the openings may be determined, for example.

The first frequency display unit 502 and the second frequency display unit 503 present the calculated resonance frequencies, for example. Also, the first frequency display unit 502 and the second frequency display unit 503 display graphics of sizes corresponding to the calculated resonance frequencies at positions based on a plurality of boundary planes included in the opening. The graphics are not particularly limited, such as a virtual rectangular parallelepiped and a rectangle, for example.

Figure 29:
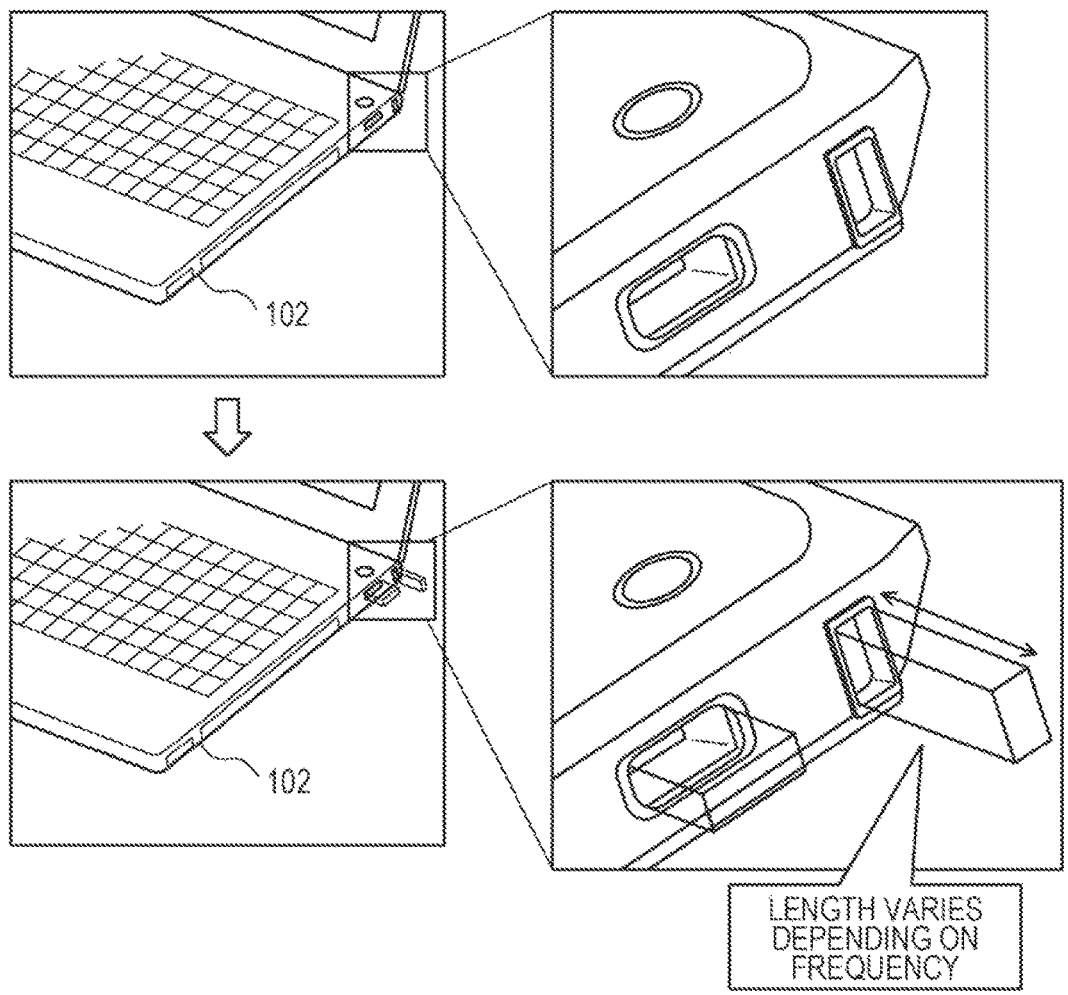
FIG. 29 is an explanatory diagram illustrating an example of visualizing and displaying the resonance frequency using a rectangular parallelepiped for each opening.

FIG. 29 is an explanatory diagram illustrating an example of visualizing and displaying the resonance frequency using a virtual rectangular parallelepiped for each opening. The upper part of FIG. 29 illustrates a state before the visualization of the resonance frequency. The lower part of FIG. 29 illustrates an example where the resonance frequency is visualized by arranging a virtual rectangular parallelepiped having a length based on the resonance frequency specified for each opening at a position based on the opening. The first frequency display unit 502 displays the virtual rectangular parallelepiped having the maximum shape of the opening such that the higher the resonance frequency specified for each opening, the longer the virtual rectangular parallelepiped outward from the object 102, for example. In the example of FIG. 29, it may be recognized at a glance that the opening on the right side has a higher resonance frequency than the opening on the left side. Thus, it is made easier for the user to recognize the level of the resonance frequency for each opening.

Figure 30:
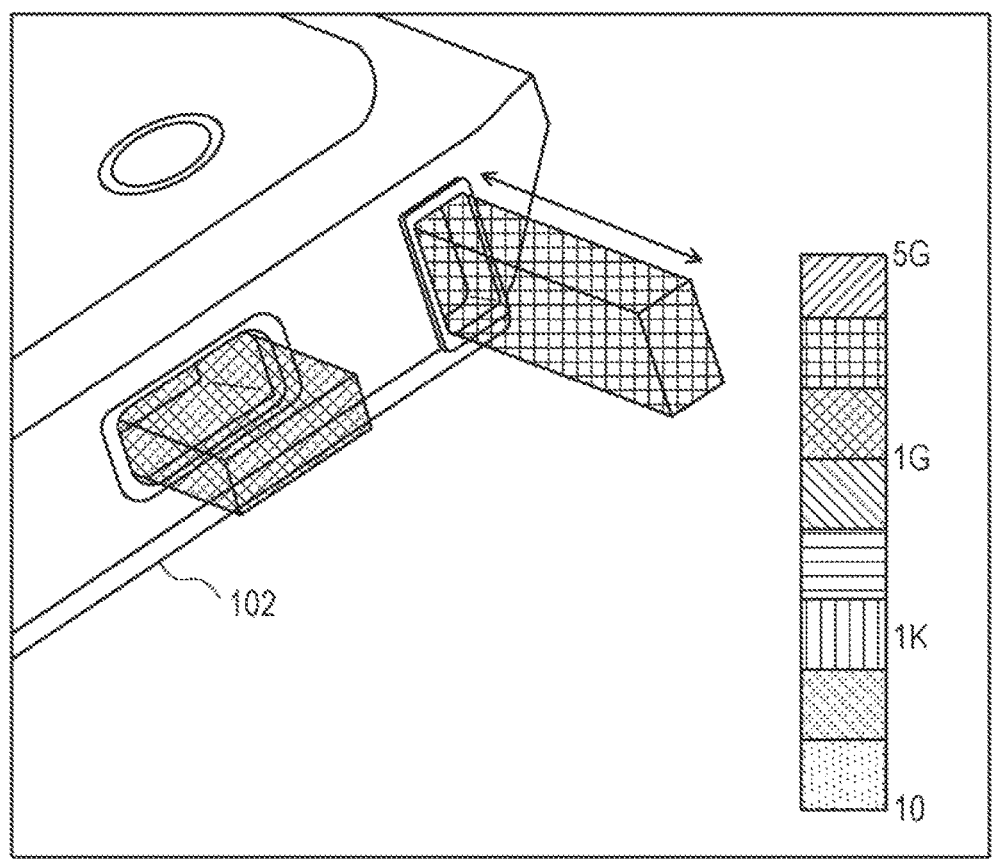
FIG. 30 is an explanatory diagram illustrating an example of visualizing and displaying the resonance frequency using a rectangular parallelepiped for each opening in combination with a legend.

FIG. 30 is an explanatory diagram illustrating an example of visualizing and displaying the resonance frequency using a virtual rectangular parallelepiped for each opening in combination with a legend. The first frequency display unit 502 may also display a legend of the resonance frequencies when visualizing and displaying the resonance frequencies specified for the respective openings. In the example of FIG. 30, the display of the legend of the resonance frequencies makes it possible for the user to recognize at a glance that the resonance frequency of the opening on the left side is about 1 GHz to 2 GHz and the resonance frequency of the opening on the right side is about 2 GHz to 3 GHz. This makes it easier for the user to recognize the level of the resonance frequency of the wave leaking through the opening for each opening.

Figure 31:
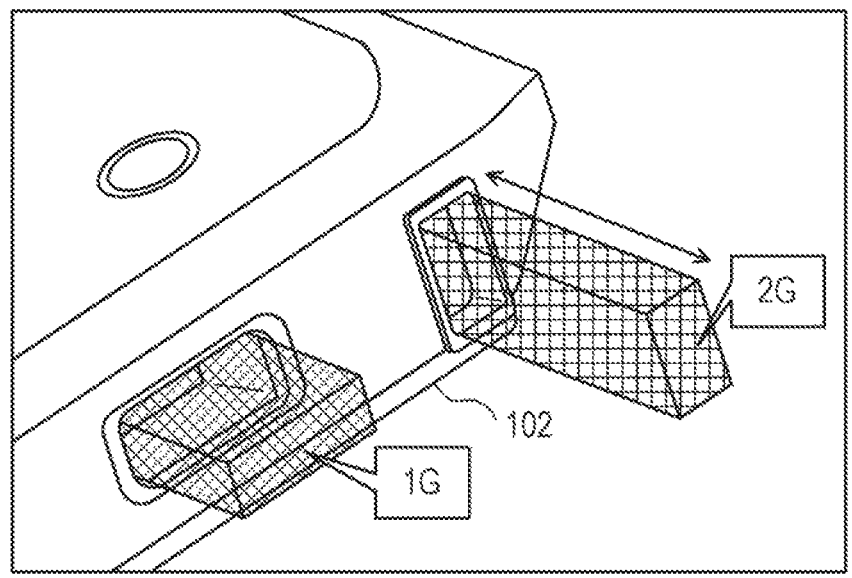
FIG. 31 is an explanatory diagram illustrating an example of visualizing and displaying the resonance frequency using a rectangular parallelepiped for each opening in combination with labels.

FIG. 31 is an explanatory diagram illustrating an example of visualizing and displaying the resonance frequency using a virtual rectangular parallelepiped for each opening in combination with labels. The first frequency display unit 502 may also display labels associated with the virtual rectangular parallelepipeds, the labels having the resonance frequencies written thereon, when visualizing and displaying the resonance frequencies by using the virtual rectangular parallelepipeds. For example, the virtual rectangular parallelepiped displayed in association with the opening on the left side has a label "1G" attached thereto, and the virtual rectangular parallelepiped displayed in association with the opening on the right side has a label "2G" attached thereto.

Figure 32:
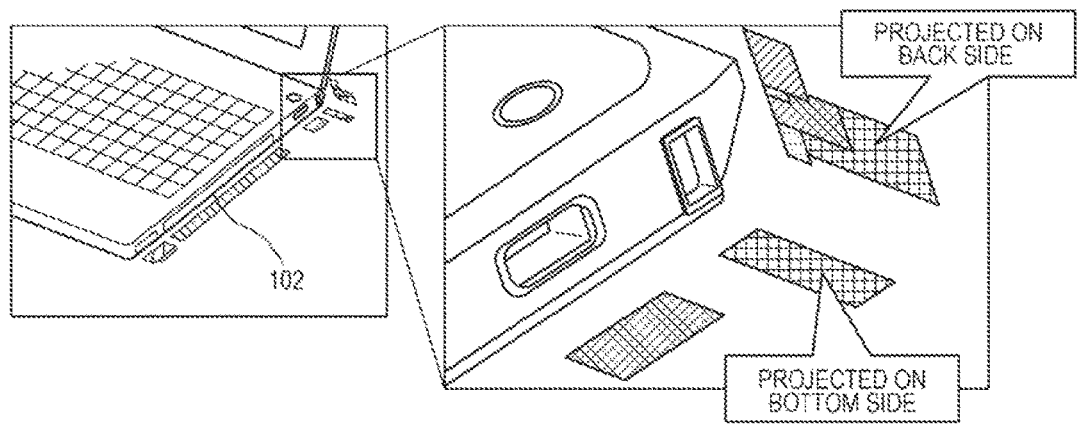
FIG. 32 is an explanatory diagram illustrating an example (Part 1) of visualizing and displaying the resonance frequency by projection for each opening.

FIG. 32 is an explanatory diagram illustrating an example (Part 1) of visualizing and displaying the resonance frequency by projection for each opening. The second frequency display unit 503 displays rectangles having lengths corresponding to the resonance frequencies by projecting the rectangles for the respective resonance frequencies onto a bottom of the first virtual rectangular parallelepiped 103. The bottom is any of the planes SF-1 to SF-6 illustrated in FIG. 8, for example, and is determined according to the arrangement of the object 102.

Moreover, the second frequency display unit 503 displays rectangles having lengths corresponding to the resonance frequencies by projecting the rectangles for the respective resonance frequencies onto a back of the first virtual rectangular parallelepiped 103. The back is any of the planes SF-1 to SF-6 illustrated in FIG. 8, for example, and is determined according to the arrangement of the object 102. This makes it easier for the user to recognize the level of the resonance frequency of the wave leaking through each opening.

Figure 33:
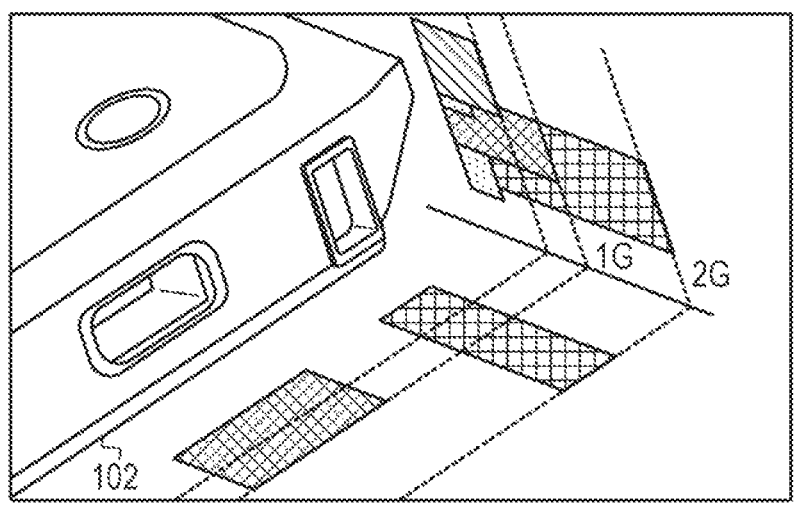
FIG. 33 is an explanatory diagram illustrating an example (Part 2) of visualizing and displaying the resonance frequency by projection for each opening.

FIG. 33 is an explanatory diagram illustrating an example (Part 2) of visualizing and displaying the resonance frequency by projection for each opening. The second frequency display unit 503 displays ruled lines corresponding to the resonance frequencies when displaying rectangles having lengths corresponding to the resonance frequencies by projecting the rectangles for the respective frequencies onto the bottom and back sides of the first virtual rectangular parallelepiped 103. Also, the second frequency display unit 503 may display the ruled lines with labels of the resonance frequencies attached thereto. In the example of FIG. 33, labels of 1 GHz and 2 GHs are attached to the ruled lines. This makes it easier for the user to recognize the level of the resonance frequency of the wave leaking through each opening.

Procedure Example of Resonance Frequency Check Processing by Resonance Frequency Check Apparatus 100

Figure 34:
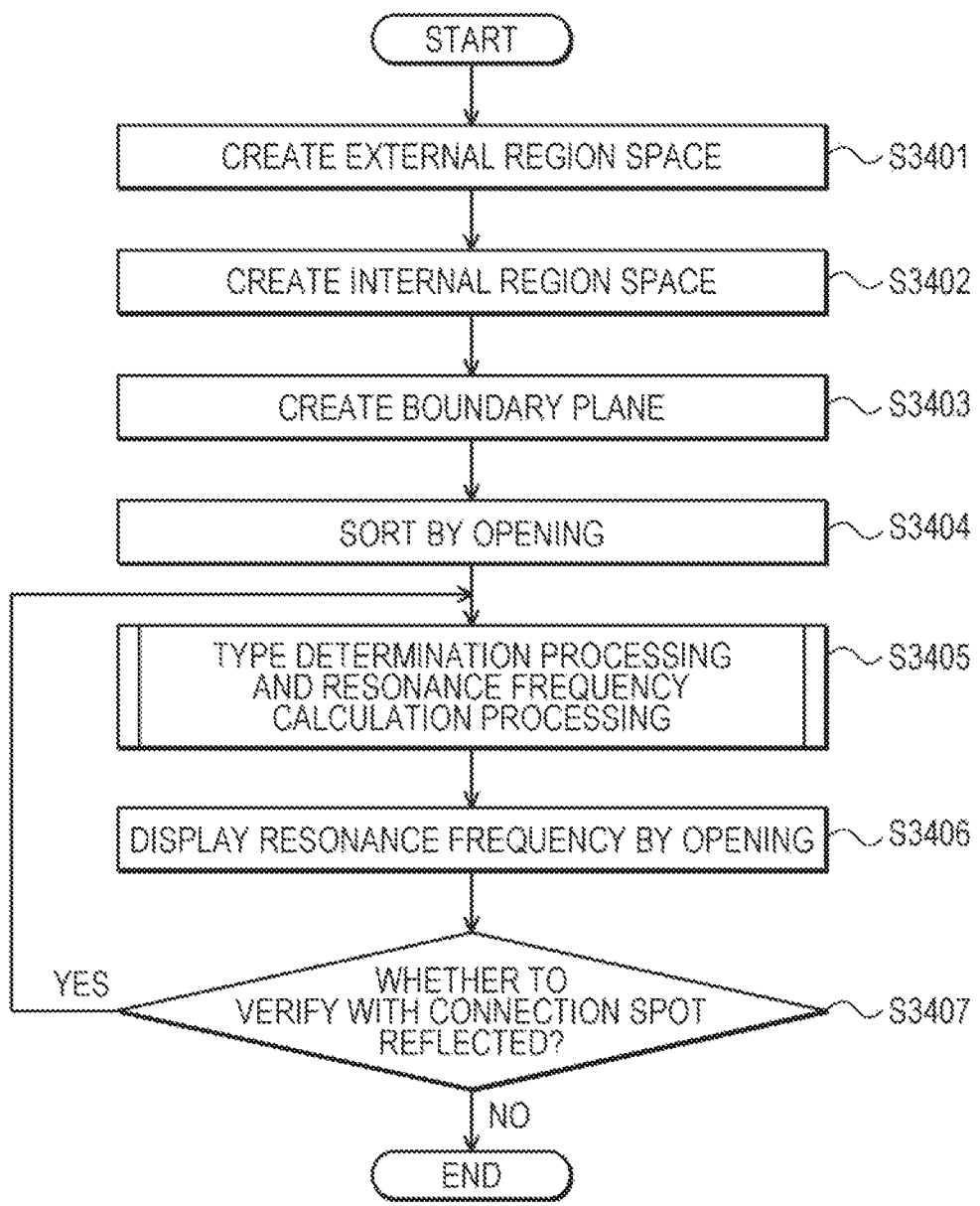
FIG. 34 is a flowchart illustrating a procedure example of resonance frequency check processing by the resonance frequency check apparatus.

FIG. 34 is a flowchart illustrating a procedure example of resonance frequency check processing by the resonance frequency check apparatus. The resonance frequency check apparatus 100 creates an external region space (Step S3401). Next, the resonance frequency check apparatus 100 creates an internal region space (Step S3402). Then, the resonance frequency check apparatus 100 creates a boundary plane where the external region space and the internal region space come into contact with each other (Step S3403).

The resonance frequency check apparatus 100 detects a consecutive boundary plane from the created boundary plane and sorts by the opening (Step S3404). Since Steps S3401 to S3404 are the conventional technique, a flowchart illustrating a detailed procedure is omitted.

The resonance frequency check apparatus 100 performs type determination processing for determining the shape type of the opening and calculation processing for calculating the resonance frequency for each of the openings (Step S3405). Then, the resonance frequency check apparatus 100 displays the resonance frequency by the opening (Step S3406).

Thereafter, the resonance frequency check apparatus 100 determines whether to verify again with the connection spot or connectable spot reflected (Step S3407). When it is determined to verify again with the connection spot or connectable spot reflected (Step S3407: Yes), the resonance frequency check apparatus 100 moves to Step S3405. When it is determined not to verify again (Step S3407: No), the resonance frequency check apparatus 100 terminates a series of processing.

Figure 35:
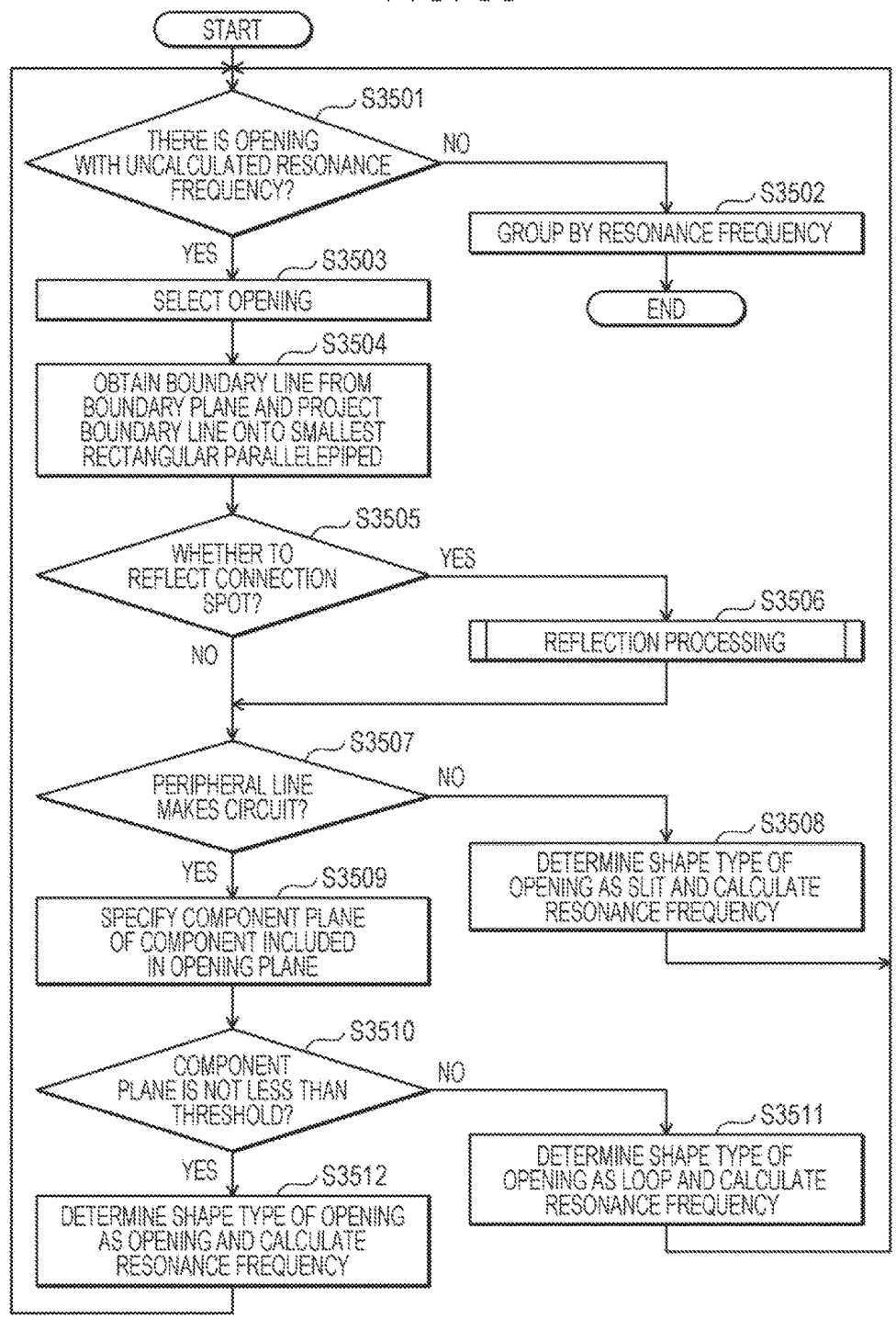
FIG. 35 is a flowchart illustrating a procedure example of type determination processing and resonance frequency calculation processing.

FIG. 35 is a flowchart illustrating a procedure example of the type determination processing and resonance frequency calculation processing. The resonance frequency check apparatus 100 determines whether or not there is an opening with an uncalculated resonance frequency (Step S3501). When it is determined that there is an opening with an uncalculated resonance frequency (Step S3501: Yes), the resonance frequency check apparatus 100 selects any of the openings with uncalculated resonance frequencies as a calculation target (Step S3503).

The resonance frequency check apparatus 100 obtains a boundary line from a boundary plane by projection, and projects the boundary line 106 onto the smallest virtual rectangular parallelepiped 104 including the opening (Step S3504). Then, the resonance frequency check apparatus 100 determines whether to reflect the connection spot (Step S3505). When it is determined to reflect the connection spot (Step S3505: Yes), the resonance frequency check apparatus 100 performs reflection processing (Step S3506) and moves to Step S3507.

When it is determined not to reflect the connection spot (Step S3505: No), the resonance frequency check apparatus 100 determines whether or not the peripheral line 107 obtained by the projection makes a circuit (Step S3507). When it is determined that the peripheral line 107 does not make a circuit (Step S3507: No), the resonance frequency check apparatus 100 determines the shape type of the opening as slit and calculates the resonance frequency (Step S3508), and then returns to Step S3501. In Step S3508, the resonance frequency check apparatus 100 calculates the resonance frequency by substituting the peripheral line of the peripheral line 107 into the equation (3).

When it is determined that the peripheral line 107 makes a circuit (Step S3507: Yes), the resonance frequency check apparatus 100 specifies a component plane of the component included in the opening plane of the opening (Step S3509). The resonance frequency check apparatus 100 determines whether or not the component plane is a threshold or more (Step S3510). When it is determined that the component plane is the threshold or more (Step S3510: Yes), the resonance frequency check apparatus 100 determines the shape type of the opening as opening and calculates the resonance frequency (Step S3512), and then returns to Step S3501. In Step S3512, the resonance frequency check apparatus 100 calculates the resonance frequency by substituting the length of the diagonal line of the peripheral line 107 into the equation (1).

When it is determined that the component plane is not the threshold or more (Step S3510: No), the resonance frequency check apparatus 100 determines the shape type of the opening as loop and calculates the resonance frequency (Step S3511), and then returns to Step S3501. In Step S3511, the resonance frequency check apparatus 100 calculates the resonance frequency by substituting the length of the peripheral line 107 into the equation (2).

When it is determined in Step S3501 that there is no opening with an uncalculated resonance frequency (Step S3501: No), the resonance frequency check apparatus 100 groups the openings by the resonance frequency (Step S3502) and terminates a series of processing.

Figure 36:
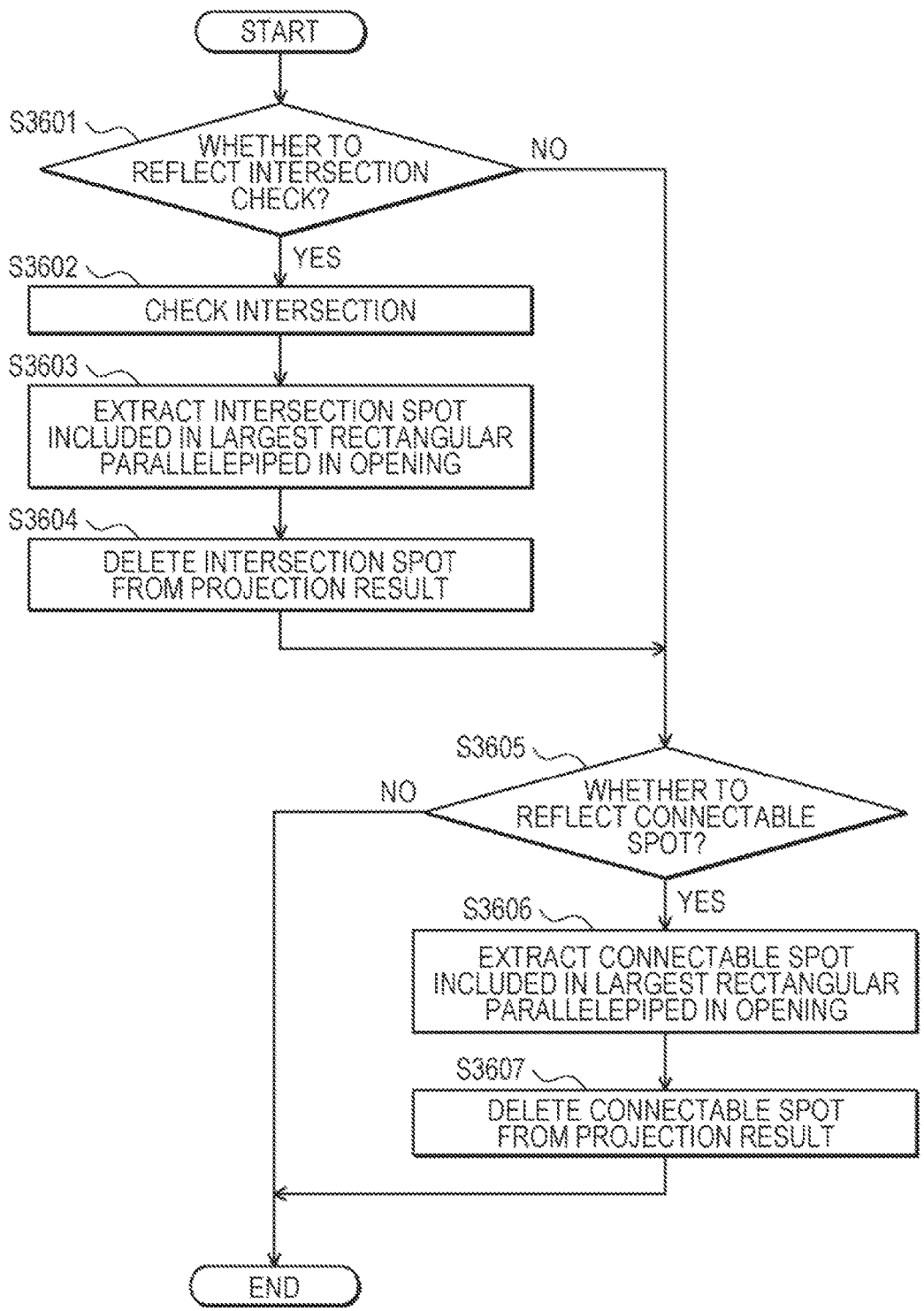
FIG. 36 is an explanatory diagram illustrating a procedure example of reflection processing illustrated in FIG. 35.

FIG. 36 is an explanatory diagram illustrating a procedure example of the reflection processing illustrated in FIG. 35. The resonance frequency check apparatus 100 determines whether to reflect intersection check (Step S3601). When it is determined not to reflect intersection check (Step S3601: No), the resonance frequency check apparatus 100 moves to Step S3605.

When it is determined to reflect intersection check (Step S3601: Yes), the resonance frequency check apparatus 100 performs the intersection check (Step S3602). Then, the resonance frequency check apparatus 100 extracts an intersection spot included in the largest virtual rectangular parallelepiped in the opening (Step S3603).

The resonance frequency check apparatus 100 deletes the intersection spot from the projection result (Step S3604) and moves to Step S3605. The resonance frequency check apparatus 100 determines whether to reflect a connectable spot (Step S3605). When it is determined not to reflect the connectable spot (Step S3605: No), the resonance frequency check apparatus 100 terminates a series of processing.

On the other hand, when it is determined to reflect the connectable spot (Step S3605: Yes), the resonance frequency check apparatus 100 extracts a connectable spot included in the largest virtual rectangular parallelepiped in the opening (Step S3606). Then, the resonance frequency check apparatus 100 deletes the connectable spot from the projection result (Step S3607) and terminates a series of processing.

As described above, the resonance frequency check apparatus 100 specifies the shape type of the opening based on the shape of the line obtained by projecting a series of boundary lines included in the opening onto the projection plane from the inward direction, and obtains the resonance frequency of the wave leaking through the opening based on the specified type. Thus, the resonance frequency of the wave leaking through the opening may be easily obtained even in the middle of designing the object. Therefore, a wave leakage spot in the object to be designed may be specified. For example, the influence of the size of the opening corresponding to the leakage spot may be confirmed beforehand, a design can be made with measures to reduce leakage of a desired frequency band through the opening, and thus rework of design may be reduced. Moreover, by specifying the leakage spot of the wave at the early stage of design where the internal structure is insufficient or unspecified, a design may be made with measures against the leakage of the wave while checking from the early stage of design. Thus, detection of problems with the leakage of the wave is reduced even if a conventional simulation is conducted at the final stage of design, and rework of design may be reduced.

Also, the resonance frequency check apparatus 100 specifies the shape type of the opening based on the shape of the peripheral line obtained by projecting the line obtained by projection onto any of the planes perpendicular to the inward direction d among the planes of the smallest virtual rectangular parallelepiped including a series of boundary planes. The shape type of the opening may be easily specified based on the shape of the peripheral line.

Moreover, when the peripheral line does not make a circuit, the resonance frequency check apparatus 100 determines the shape type of the opening as slit and calculates the resonance frequency based on the length of the peripheral line. Thus, the shape of the opening may be determined in more detail.

On the other hand, when the peripheral line makes a circuit, the resonance frequency check apparatus 100 specifies the shape type of the opening based on the ratio of the component on the plane perpendicular to the inward direction. Thus, the shape of the opening may be determined in more detail.

Moreover, when the ratio of the component on any of the planes is the threshold or more, the resonance frequency check apparatus 100 determines the shape type of the opening as loop and calculates the resonance frequency based on the length of the peripheral line. Thus, the resonance frequency may be more accurately obtained based on the shape of the opening.

Moreover, when the ratio of the component on any of the planes is not the threshold or more, the resonance frequency check apparatus 100 determines the shape type of the opening as opening and calculates the resonance frequency based on the length of the diagonal line of any of the planes. Thus, the resonance frequency may be more accurately obtained based on the shape of the opening.

Moreover, the resonance frequency check apparatus 100 specifies the shape type of the opening based on the shape of the line obtained by deleting the line corresponding to the connection spot from the projected line. This may simplify verification of how the resonance frequency in the opening changes with a change in the connection state around the opening between conductive components.

Moreover, the resonance frequency check apparatus 100 specifies the shape type of the opening based on the shape of the peripheral line obtained by excluding the line corresponding to the connectable spot from the plane of the first component close to each plane of the smallest virtual rectangular parallelepiped to the plane of the second component close to the plane of the first component, from the projected peripheral line. Here, the first component and the second component do not interfere with each other. The expression that the plane of the first component and the plane of the second component are close to each other means that the plane of the first component and the plane of the second component are spatially close to each other. This may simplify verification of how the resonance frequency in the opening changes with a change in the connection state around the opening between the conductive components without changing the shape of the opening or arranging a model for connection by specifying the connectable spot. Therefore, the design of the object may be simplified.

Moreover, the resonance frequency check apparatus 100 displays graphics having lengths corresponding to the calculated resonance frequencies at positions based on the openings. For example, the resonance frequency check apparatus 100 may display virtual rectangular parallelepipeds having lengths corresponding to the resonance frequencies at the positions of the openings. Moreover, for example, the resonance frequency check apparatus 100 may display rectangles having lengths corresponding to the resonance frequencies at positions of the openings corresponding to the bottom and back of the first virtual rectangular parallelepiped. Furthermore, the resonance frequency check apparatus 100 may display ruled lines, labels, and the like, which make it possible to recognize the resonance frequencies, in association with the graphics. This makes it possible for the user to recognize the level of the resonance frequency of the wave leaking through the opening for each opening.

Moreover, the resonance frequency check apparatus 100 displays a sort result obtained by sorting the resonance frequencies calculated for the plurality of openings, respectively, by a predetermined frequency band. This makes it possible for the user to recognize what kind of resonance frequency is leaking.

Note that the resonance frequency check method described in this embodiment may be realized by executing the prepared resonance frequency check program with a computer such as a personal computer and a work station. This resonance frequency check program is recorded on a computer-readable recording medium such as a magnetic disk, an optical disk, and a USB flash memory, and is executed by being read from the recording medium by the computer. Moreover, the resonance frequency check program may be distributed through a network such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory, computer-readable recording medium having stored therein a program for causing a computer including a processor to couple to a memory to execute a process, the process by the computer comprising:

storing, in the memory, information to indicate, in a simulated space, a first virtual rectangular parallelepiped having a plurality of first planes to simulate a virtual object including a plurality of components to be contained in the first virtual rectangular parallelepiped;

specifying a type of a shape of an opening, which includes a series of boundary planes of the plurality of components detected from second planes of a plurality of second virtual rectangular parallelepipeds obtained by dividing the first virtual rectangular parallelepiped, based on a first shape of a first line corresponding to a first component, among the components, by projecting the series of boundary planes from an inward direction to the opening based on a specified plane among the first planes of the first virtual rectangular parallelepiped onto a projection plane among the first planes of the first virtual rectangular parallelepiped which is perpendicular to the inward direction and which is located at a position more distant from the specified plane than from the series of boundary planes; and calculating a resonance frequency of a wave leaking through the opening, based on the specified type of shape of the opening according to the series of boundary planes projected onto the projection plane and reference resonance frequency information obtained from the memory to obtain a projectable image corresponding to the calculated resonance frequency, the projectable image to be displayed on a display.

2. The non-transitory, computer-readable recording medium according to claim 1, wherein in the specifying the type of the shape of the opening, the type of the shape of the opening is specified based on a second shape of a second line obtained by projecting a portion of the first line onto each of sides forming any of planes perpendicular to the inward direction among planes of a smallest virtual rectangular parallelepiped including the series of boundary planes, the portion of the first line being a portion whose distance from each of the sides meets a determined condition.

3. The non-transitory, computer-readable recording medium according to claim 2, wherein in the specifying the type of the shape of the opening, the type of the shape is specified based on whether the second shape of the second line obtained by projecting the portion of the first line is a third shape which makes a circuit of a periphery of the any of the planes.

4. The non-transitory, computer-readable recording medium according to claim 3, wherein in the calculating the resonance frequency, when the second shape of the second line is not the third shape which makes the circuit of the periphery of the any of the planes, the resonance frequency is calculated based on a length of the second line obtained by projecting the portion of the first line.

5. The non-transitory, computer-readable recording medium according to claim 3, wherein in the specifying the type of the shape of the opening, when the second shape of the second line is the third shape which makes the circuit of the periphery, the type of the shape of the opening is specified based on a ratio of components included in the any of the planes, among the plurality of components included in the virtual object.

6. The non-transitory, computer-readable recording medium according to claim 5, wherein in the calculating the resonance frequency, when the ratio is greater than or equal to a threshold value, the resonance frequency is calculated based on a length of the second line obtained by projecting the portion of the first line.

7. The non-transitory, computer-readable recording medium according to claim 5, wherein in the calculating the resonance frequency, when the ratio is not greater than or equal to the threshold value, the resonance frequency is calculated based on a length of a diagonal line of the any of the planes.

8. The non-transitory, computer-readable recording medium according to claim 2, the program causing the computer to further execute processing of:

extracting a position where interference occurs between a first plurality of components included in the smallest virtual rectangular parallelepiped among the plurality of components included in the virtual object, wherein in the specifying the type of the shape of the opening, the type of the shape of the opening is specified based on a fourth shape of a fourth line obtained by excluding, from the second line, a portion corresponding to the extracted position.

9. The non-transitory, computer-readable recording medium according to claim 2, the program causing the computer to further execute processing of:

extracting a combination of a plane of a first component within a first predetermined distance from each plane of the smallest virtual rectangular parallelepiped among the plurality of components included in the virtual object, and a plane of a second component whose distance from the plane of the first component is within a second predetermined distance among planes of a component different from the first component among the plurality of components, wherein in the specifying the shape type of the opening, the type of the shape of the opening is specified based on a fourth shape of a fourth line obtained by excluding, from the second line, a portion corresponding to a position from the plane of the first component included in the extracted combination to the plane of the second component included in the extracted combination.

10. The non-transitory, computer-readable recording medium according to claim 1, wherein the obtained projectable image is a graphic of a size corresponding to the calculated resonance frequency to be displayed at a position based on the series of boundary planes in the simulated space.

11. The non-transitory, computer-readable recording medium according to claim 1, wherein when the specifying specifies types of shapes of a plurality of openings, providing a sort result of the plurality of the openings according to a frequency band of resonance frequencies respectively calculated for the plurality of openings.

12. A resonance frequency check method by a computer including a processor to couple to a memory to execute processing of:

storing, in the memory, information to indicate, in a simulated space, a first virtual rectangular parallelepiped having a plurality of first planes to simulate a virtual object including a plurality of components to be contained in the first virtual rectangular parallelepiped;

specifying a type of a shape of an opening, which includes a series of boundary planes of the plurality of components detected from second planes of a plurality of second virtual rectangular parallelepipeds obtained by dividing the first virtual rectangular parallelepiped, based on a first shape of a first line corresponding to a first component, among the components, by projecting the series of boundary planes from an inward direction to the opening based on a specified plane among the first planes of the first virtual rectangular parallelepiped, onto a projection plane among the first planes of the first virtual rectangular parallelepiped which is perpendicular to the inward direction and which is located at a position more distant from the specified plane than the series of boundary planes; and calculating a resonance frequency of a wave leaking through the opening, based on the specified type of shape of the opening according to the series of boundary planes projected onto the projection plane and reference resonance frequency information obtained from the memory to obtain a projectable image corresponding to the calculated resonance frequency, the projectable image to be displayed on a display.

13. An apparatus, comprising:

a processor to couple to a memory and configured to:
    store, in the memory, information to indicate, in a simulated space, a first virtual rectangular parallelepiped having a plurality of first planes to simulate a virtual object including a plurality of components to be contained in the first virtual rectangular parallelepiped;
    specify a type of a shape of an opening, which includes a series of boundary planes of the plurality of components detected from second planes of a plurality of second virtual rectangular parallelepipeds obtained by dividing the first virtual rectangular parallelepiped, based on a first shape of a first line corresponding to a first component, among the components, by projecting the series of boundary planes from an inward direction to the opening based on a specified plane among the first planes of the first virtual rectangular parallelepiped, onto a projection plane among the first planes of the first virtual rectangular parallelepiped which is perpendicular to the inward direction and which is located at a position more distant from the specified plane than from the series of boundary planes, and
    calculate a resonance frequency of a wave leaking through the opening, based on the specified type of shape of the opening according to the series of boundary planes projected onto the projection plane and reference resonance frequency information obtained from the memory to obtain a projectable image corresponding to the calculated resonance frequency, the projectable image to be displayed on a display.

\* \* \* \* \*